(12) United States Patent
Chen et al.

(10) Patent No.: US 12,550,784 B2
(45) Date of Patent: Feb. 10, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Chun-Jen Chen, Jhubei (TW); Wei-Chun Pai, Hsinchu (TW); Cheng Wei Ho, Taoyuan (TW); Sheng-Huan Chiu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 559 days.

(21) Appl. No.: 17/743,086

(22) Filed: May 12, 2022

(65) Prior Publication Data

US 2023/0245991 A1 Aug. 3, 2023

Related U.S. Application Data

(60) Provisional application No. 63/267,321, filed on Jan. 31, 2022.

(51) Int. Cl.
*H01L 23/00* (2006.01)
*H01L 23/538* (2006.01)
(Continued)

(52) U.S. Cl.
CPC .......... *H01L 24/24* (2013.01); *H01L 23/5381* (2013.01); *H01L 23/5386* (2013.01);
(Continued)

(58) Field of Classification Search
CPC ..... H01L 24/24; H01L 23/5381; H01L 24/19; H01L 23/49816; H01L 23/49833;
(Continued)

(56) References Cited

U.S. PATENT DOCUMENTS

| 9,000,584 | B2 | 4/2015 | Lin et al. |
| 9,048,222 | B2 | 6/2015 | Hung et al. |

(Continued)

FOREIGN PATENT DOCUMENTS

| CN | 105990290 A | 10/2016 |
| CN | 111883481 A | 11/2020 |

(Continued)

*Primary Examiner* — Jacob Y Choi
*Assistant Examiner* — Ashley Nicole Blackwell
(74) *Attorney, Agent, or Firm* — Slater Matsil, LLP

(57) ABSTRACT

In an embodiment, a device includes: an integrated circuit die including a die connector; a dielectric layer on the integrated circuit die; an under-bump metallurgy layer having a line portion on the dielectric layer and having a via portion extending through the dielectric layer to contact the die connector; a through via on the line portion of the under-bump metallurgy layer, the through via having a first curved sidewall proximate the die connector, the through via having a second curved sidewall distal the die connector, the first curved sidewall having a longer arc length than the second curved sidewall; and an encapsulant around the through via and the under-bump metallurgy layer.

20 Claims, 28 Drawing Sheets

(51) Int. Cl.
*H01L 25/065* (2023.01)
*H01L 23/48* (2006.01)
*H01L 23/498* (2006.01)

(52) U.S. Cl.
CPC .......... *H01L 24/19* (2013.01); *H01L 25/0655* (2013.01); *H01L 23/481* (2013.01); *H01L 23/49816* (2013.01); *H01L 23/49822* (2013.01); *H01L 23/49833* (2013.01); *H01L 23/5385* (2013.01); *H01L 24/16* (2013.01); *H01L 24/32* (2013.01); *H01L 24/73* (2013.01); *H01L 2224/16268* (2013.01); *H01L 2224/2401* (2013.01); *H01L 2224/2405* (2013.01); *H01L 2224/24225* (2013.01); *H01L 2224/32265* (2013.01); *H01L 2224/73204* (2013.01)

(58) Field of Classification Search
CPC ..... H01L 23/5385; H01L 24/16; H01L 24/32; H01L 224/16268; H01L 2224/2401; H01L 2224/2405; H01L 2224/24225; H01L 2224/32265; H01L 2224/73204; H01L 23/5386; H01L 25/0655; H01L 23/481; H01L 23/49822; H01L 24/73; H01L 2224/16268; H01L 21/76885; H01L 23/5283; H01L 25/16; H01L 25/18; H01L 2225/06548; H01L 25/0652; H01L 2225/06524; H01L 2225/06541; H01L 25/50; H01L 25/105; H01L 23/5384; H01L 24/13; H01L 2225/1035; H01L 2225/1041; H01L 2225/1058; H01L 21/76897; H01L 23/3185; H01L 23/5389; H01L 25/0657; H01L 2224/04105; H01L 2224/14104; H01L 2225/06527

USPC ........................................................ 257/288
See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 10,115,647 | B2 | 10/2018 | Huang et al. |
| 10,163,832 | B1* | 12/2018 | Huang .............. H01L 23/49811 |
| 10,269,767 | B2 | 4/2019 | Chen et al. |
| 10,276,541 | B2 | 4/2019 | Chen et al. |
| 10,804,227 | B2 | 10/2020 | Kamgaing et al. |
| 11,256,029 | B2 | 2/2022 | Kannan et al. |
| 11,315,848 | B2 | 4/2022 | Nishimura |
| 2001/0026954 | A1* | 10/2001 | Takao ..................... H01L 24/11 257/784 |
| 2010/0052164 | A1 | 3/2010 | Lee et al. |
| 2012/0043654 | A1* | 2/2012 | Lu ............................ H01L 24/11 257/737 |
| 2019/0259722 | A1* | 8/2019 | Pokhrel .................. C25D 5/022 |
| 2021/0035907 | A1* | 2/2021 | Chen ........................ H01L 24/13 |

FOREIGN PATENT DOCUMENTS

| | | | |
|---|---|---|---|
| JP | 2020136507 | A | 8/2020 |
| KR | 20160111297 | A | 9/2016 |
| KR | 20170015073 | A | 2/2017 |
| TW | 201803043 | A | 1/2018 |
| TW | 202017123 | A | 5/2020 |

\* cited by examiner

INTEGRATED CIRCUIT PACKAGES AND METHODS OF FORMING THE SAME

PRIORITY CLAIM AND CROSS-REFERENCE

This application claims the benefit of U.S. Provisional Application No. 63/267,321 filed on Jan. 31, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
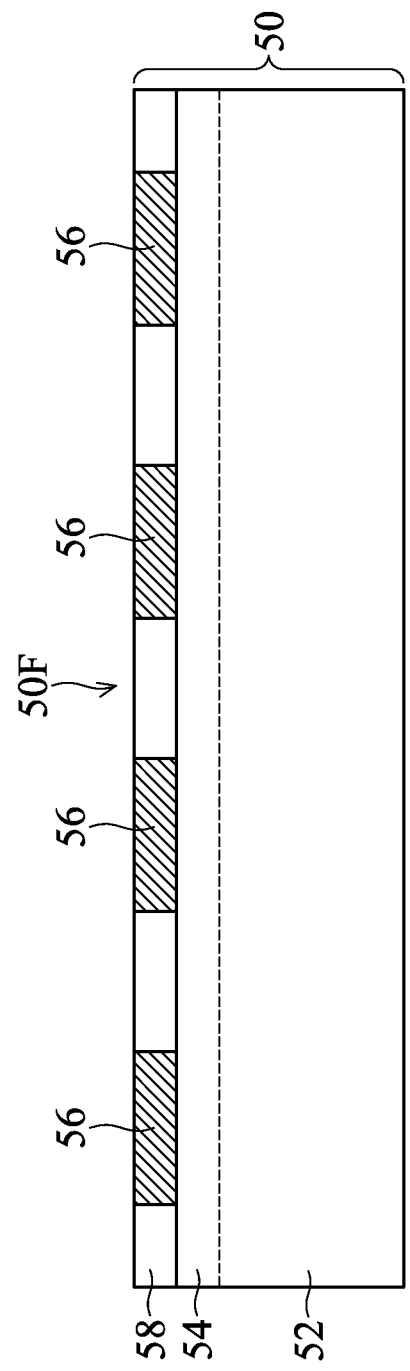
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, through vias for integrated circuit packages are formed having curved sidewalls. The through vias are formed on under-bump metallurgy layers. An encapsulant is formed around the through vias and the under-bump metallurgy layers. The curved sidewalls of the through vias may be concave sidewalls, such that the through vias have hourglass shapes, or may be convex sidewalls, such that the through vias have bulged rectangle shapes. Forming the through vias with curved sidewalls can reduce the amount of stress that concentrates on the respective interfaces between the through vias and the encapsulant, reducing the risk of the encapsulant delaminating from the through vias. Additionally or alternatively, forming the through vias with curved sidewalls can reduce the amount of stress that concentrates on the respective junctions between the through vias and the underlying under-bump metallurgy layers, reducing the risk of cracks forming between the through vias and the under-bump metallurgy layers. The reliability of the resulting package may thus be increased. In some embodiments, the through vias have proximal sidewalls which face towards respective die connectors of an underlying integrated circuit die, and distal sidewalls which are opposite the proximal sidewalls. The proximal sidewalls have a greater arc length than the distal sidewalls. The proximal sidewalls may undergo more stress than the distal sidewalls, and forming the proximal sidewalls with a greater arc length allows the proximal sidewalls to reduce or disperse more stress than the distal sidewalls.

FIG. 1 is a cross-sectional view of an integrated circuit die 50. Integrated circuit dies 50 will be packaged in subsequent processing to form an integrated circuit package. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front-side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front-side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are substantially coplanar (within process variations). The die connectors 56 and the dielectric layer 58 are exposed at the front-side 50F of the integrated circuit die 50.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias (not separately illustrated). Each of the semiconductor substrates 52 may (or may not) have a separate interconnect structure 54.

FIGS. 2-10 are cross-sectional views of intermediate stages in the manufacturing of an integrated circuit package 100, in accordance with some embodiments. Specifically, an integrated circuit package 100 is formed by packaging one or more integrated circuit dies 50 in a package region 102A. The package region 102A will be singulated in subsequent processing to form the integrated circuit package 100. Processing of one package region 102A is illustrated, but it should be appreciated that any number of package regions 102A can be simultaneously processed to form any number of integrated circuit packages 100.

Figure 2:
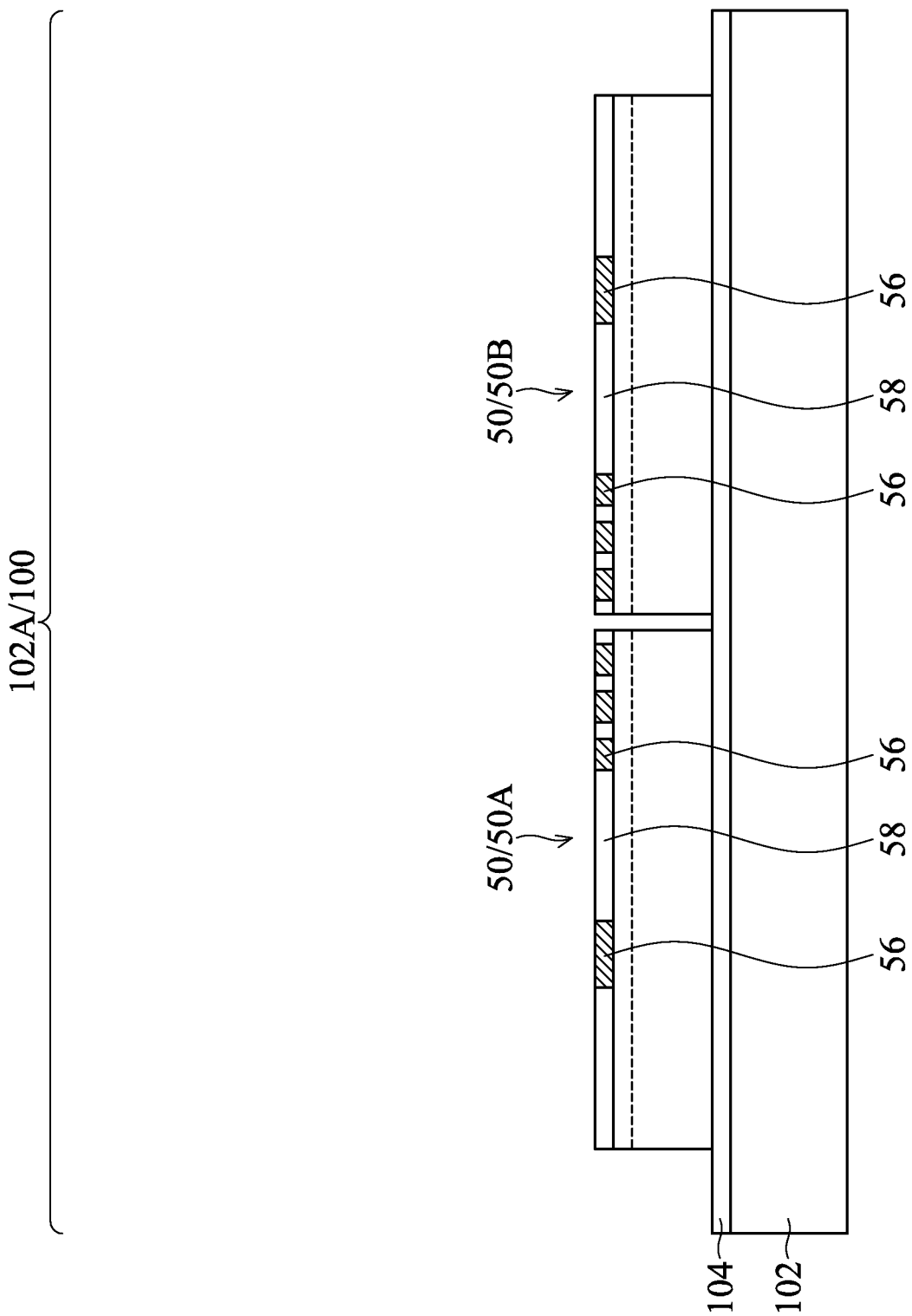
FIGS. 2-10 are cross-sectional views of intermediate stages in the manufacturing of an integrated circuit package, in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be planarized and may have a high degree of planarity.

Semiconductor dies such as integrated circuit dies 50 (e.g., a first integrated circuit die 50A and a second integrated circuit die 50B) are placed on the release layer 104. A desired type and quantity of integrated circuit dies 50 are placed in the package region 102A. The integrated circuit dies 50 may be placed by, e.g., a pick-and-place process. In the embodiment shown, multiple integrated circuit dies 50 are placed adjacent one another, including the first integrated circuit die 50A and the second integrated circuit die 50B in the package region 102A. The first integrated circuit die 50A may be a logic device, such as a central processing unit (CPU), graphics processing unit (GPU), system-on-a-chip (SoC), microcontroller, or the like. The second integrated circuit die 50B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 50A, 50B may be the same type of dies, such as SoC dies. The first integrated circuit die 50A and the second integrated circuit die 50B may be formed in processes of a same technology node, or may be formed in processes of different technology nodes. For example, the first integrated circuit die 50A may be formed of a more advanced process node than the second integrated circuit die 50B. The integrated circuit dies 50A, 50B may have different sizes (e.g., different heights and/or surface areas), or may have the same size (e.g., same heights and/or surface areas).

Figure 3:
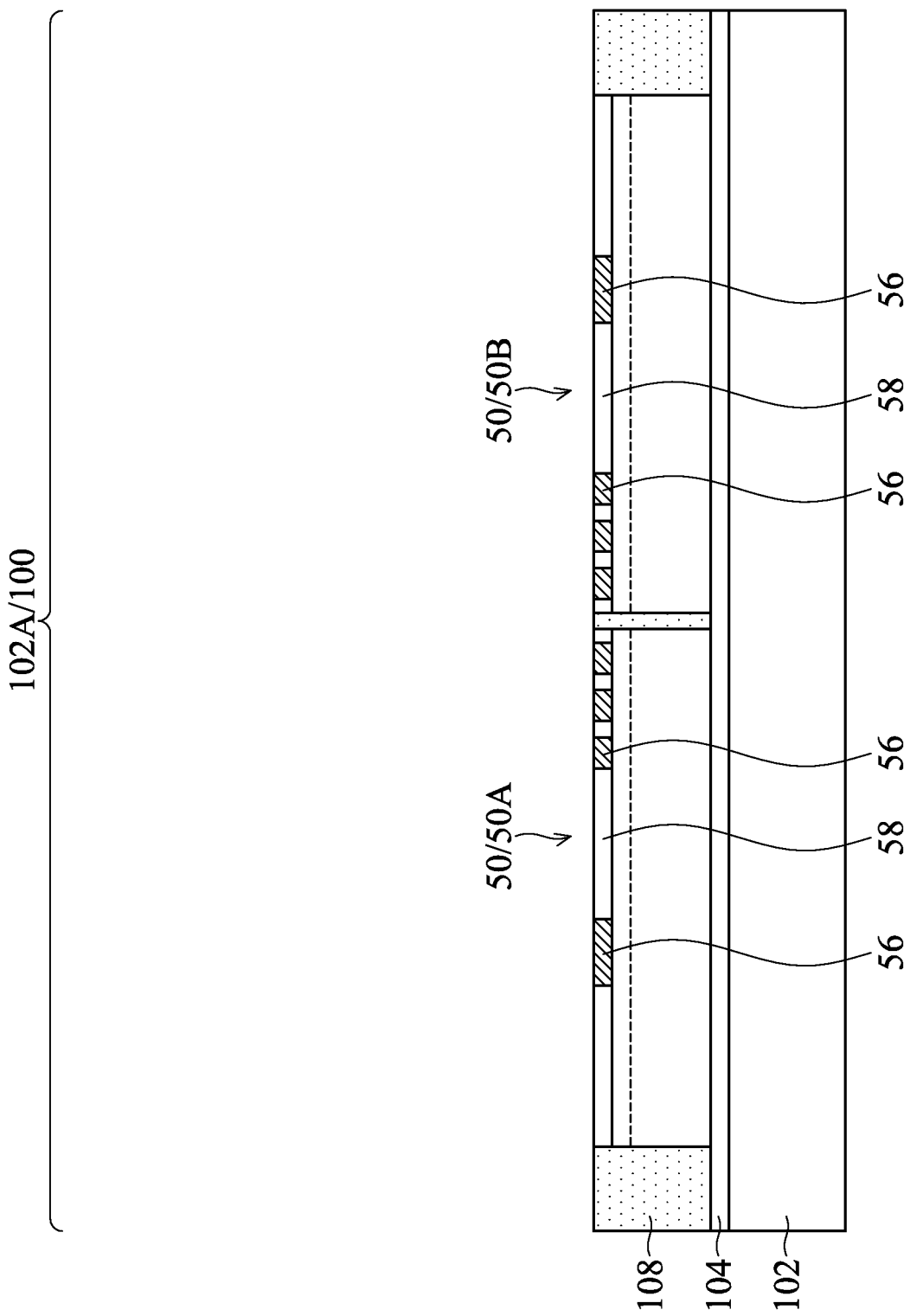

In FIG. 3, an encapsulant 108 is formed around the integrated circuit dies 50 and on the release layer 104. After formation, the encapsulant 108 encapsulates the integrated circuit dies 50. The encapsulant 108 may be a molding compound, epoxy, or the like. In some embodiments, the encapsulant 108 includes a polymer resin having fillers disposed therein. The encapsulant 108 may be applied by compression molding, transfer molding, or the like, and may be dispensed over the carrier substrate 102 such that the integrated circuit dies 50 are buried or covered. The encapsulant 108 is further dispensed in gap regions between the integrated circuit dies 50. The encapsulant 108 may be applied in liquid or semi-liquid form and then subsequently cured. A removal process may be performed on the encapsulant 108 to expose the die connectors 56 of the integrated circuit dies 50. The removal process may remove material of the encapsulant 108 and the integrated circuit dies 50 (e.g., the die connectors 56 and the dielectric layer 58) until the die connectors 56 are exposed. The removal process may be, for example, planarization process such as a chemical-mechanical polish (CMP), a grinding process, or the like. After the planarization process, top surfaces of the encapsulant 108 and the integrated circuit dies 50 (e.g., the die connectors 56 and the dielectric layer 58) are substantially coplanar (within process variations). In some embodiments, the removal process may be omitted, for example, if the die connectors 56 are already exposed.

Figure 4:
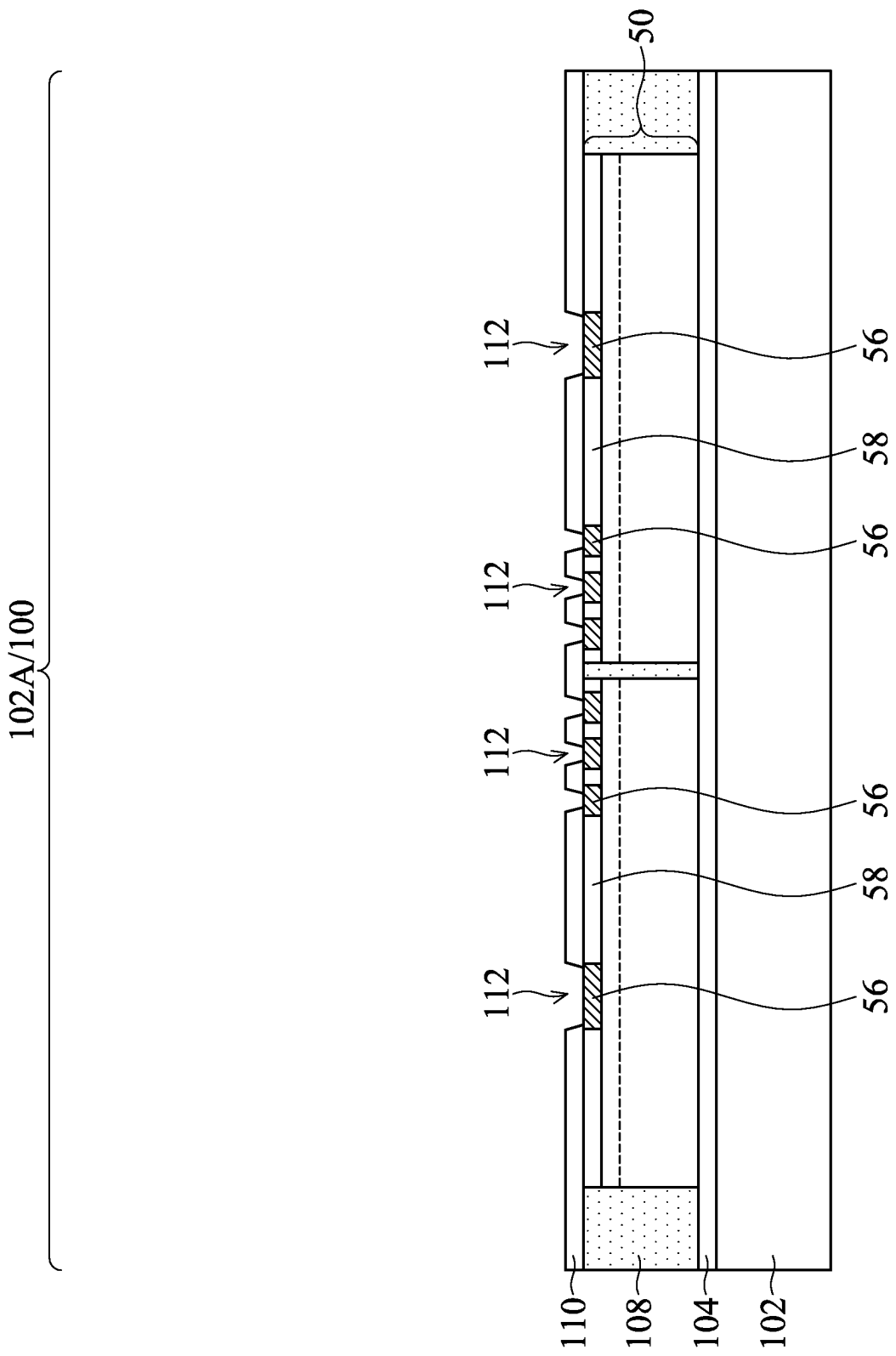

In FIG. 4, a dielectric layer 110 is deposited on the encapsulant 108 and the integrated circuit dies 50 (e.g., on the die connectors 56 and the dielectric layer 58). The dielectric layer 110 may be formed of a photosensitive material which may be patterned using a lithography mask, such as PBO, polyimide, a BCB-based polymer, a cyclic olefin copolymer, an acryl-based copolymer, or the like, which may be formed by spin coating, lamination, CVD, or the like. Other acceptable dielectric materials formed by any acceptable process may be used. The dielectric layer 110 is then patterned. The patterning forms openings 112 in the dielectric layer 110 exposing portions of the die connectors 56. The patterning may be performed by an acceptable process, such as by exposing the dielectric layer 110 to light and developing it when the dielectric layer 110 is a photosensitive material, or by etching using, for example, an anisotropic etch.

Figure 5:
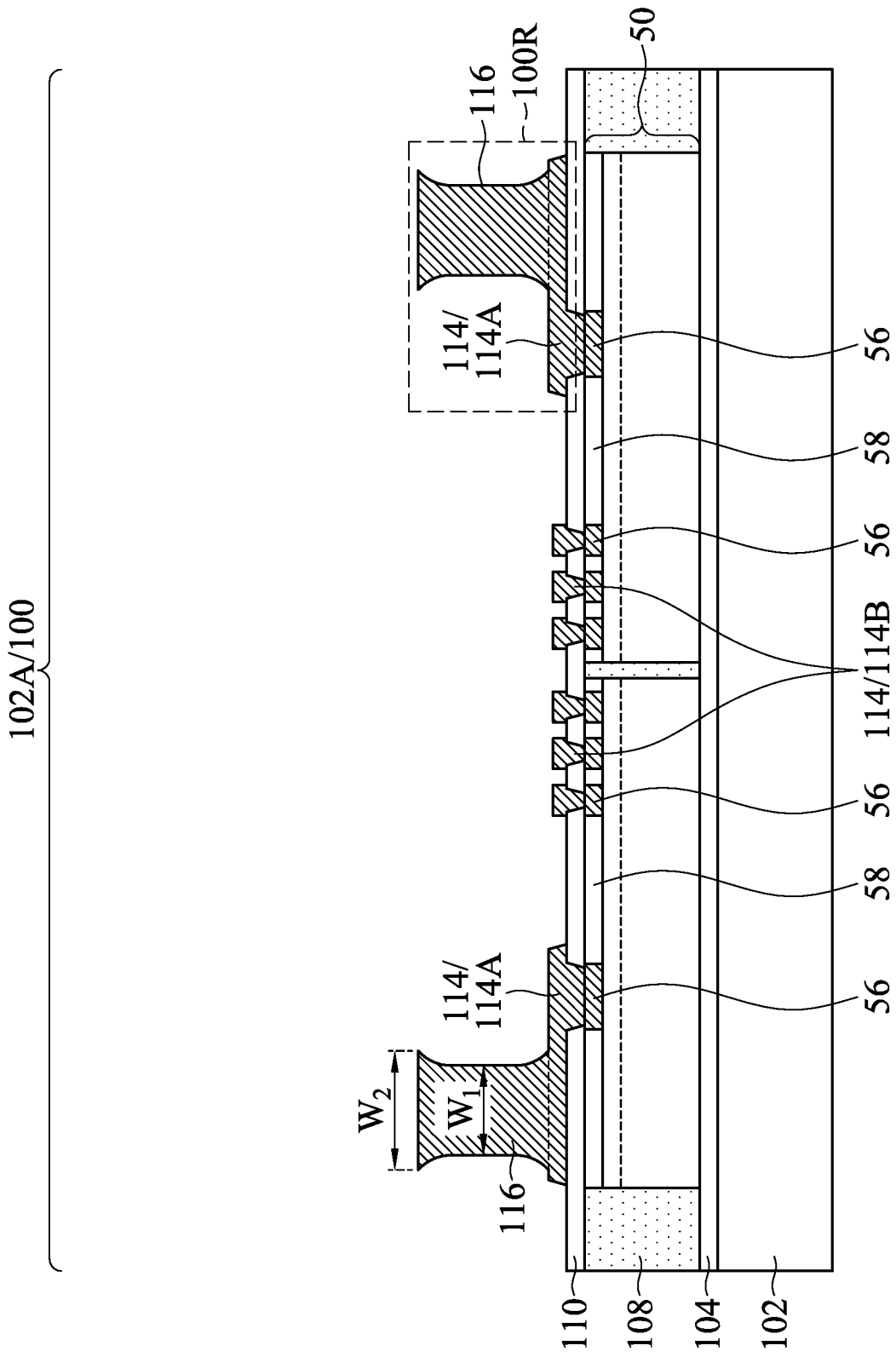

In FIG. 5, under-bump metallurgy layers (UBMLs) 114 are formed in the openings 112. The UBMLs 114 have line portions on and extending along the major surface of the dielectric layer 110, and have via portions extending through the dielectric layer 110 to contact the die connectors 56 of the integrated circuit dies 50, such that the UBMLs 114 are physically and electrically coupled to the integrated circuit dies 50.

Through vias 116 are formed on a first subset of the UBMLs 114A (e.g., on the line portions of the UBMLs 114A). A second subset of the UBMLs 114B remain free of the through vias 116. The UBMLs 114A and the through vias 116 will be subsequently utilized for connection to higher layers of the integrated circuit package 100. The UBMLs 114B will be subsequently utilized for connection to interconnection dies that directly connect and allow communication between the integrated circuit dies 50 (e.g., between the integrated circuit dies 50A, 50B, see FIG. 3).

As will be subsequently described in greater detail, the through vias 116 are formed so that they have curved sidewalls. Forming the through vias 116 with curved sidewalls can reduce the amount of stress that concentrates on the through vias 116, thereby reducing the risk of delamination and/or cracking and increasing the reliability of the resulting package. In this embodiment, the curved sidewalls of the through vias 116 are concave sidewalls, such that each of the through vias 116 has an hourglass shape. As a result of the hourglass shape, the through vias 116 have multiple widths (subsequently described for FIG. 11), such that the center portions of the through vias 116 have a lesser width than the end portions of the through vias 116. In another embodiment (subsequently described for FIGS. 14-15), the curved sidewalls of the through vias 116 are convex sidewalls, such that each of the through vias 116 has a bulged rectangle shape.

FIGS. 6A-6H are cross-sectional views of intermediate stages in the manufacturing of the UBMLs 114 and the through vias 116, in accordance with some embodiments. Details in a region 100R of FIG. 5 are illustrated. A process for forming a through via 116 with concave sidewalls is shown.

Figure 6A:
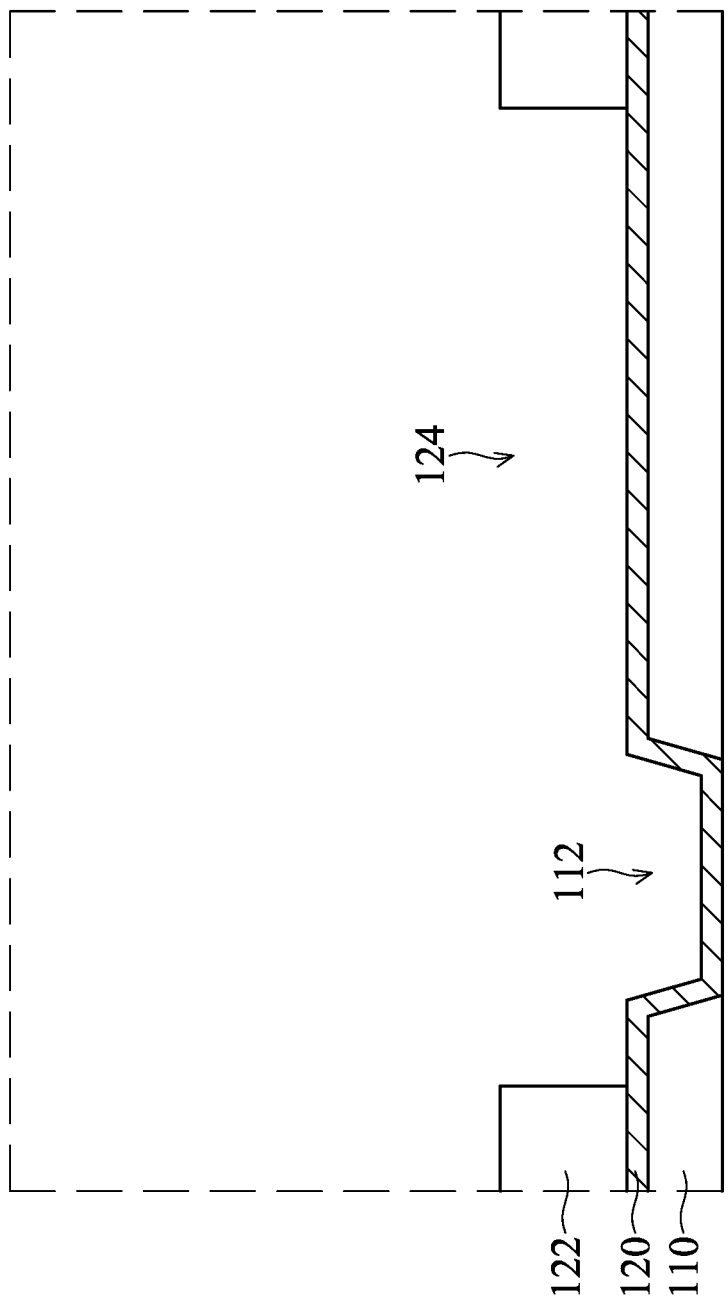

In FIG. 6A, a seed layer 120 is formed over the dielectric layer 110 and in the openings 112. In some embodiments, the seed layer 120 is a metal layer, which may be a single layer or a composite layer comprising a plurality of sub-layers formed of different materials. In some embodiments, the seed layer 120 includes a titanium layer and a copper layer over the titanium layer. The seed layer 120 may be formed using, for example, PVD or the like.

A first mask 122 is then formed and patterned on the seed layer 120. The first mask 122 may be a photoresist formed by spin coating or the like and may be exposed to light for patterning. The pattern of the first mask 122 corresponds to the UBMLs 114 (see FIG. 6H). The patterning forms openings 124 through the first mask 122 to expose the seed layer 120. The first mask 122 has straight sidewalls defining the openings 124, where the straight sidewalls are perpendicular to a major surface of the first mask 122.

Figure 6B:
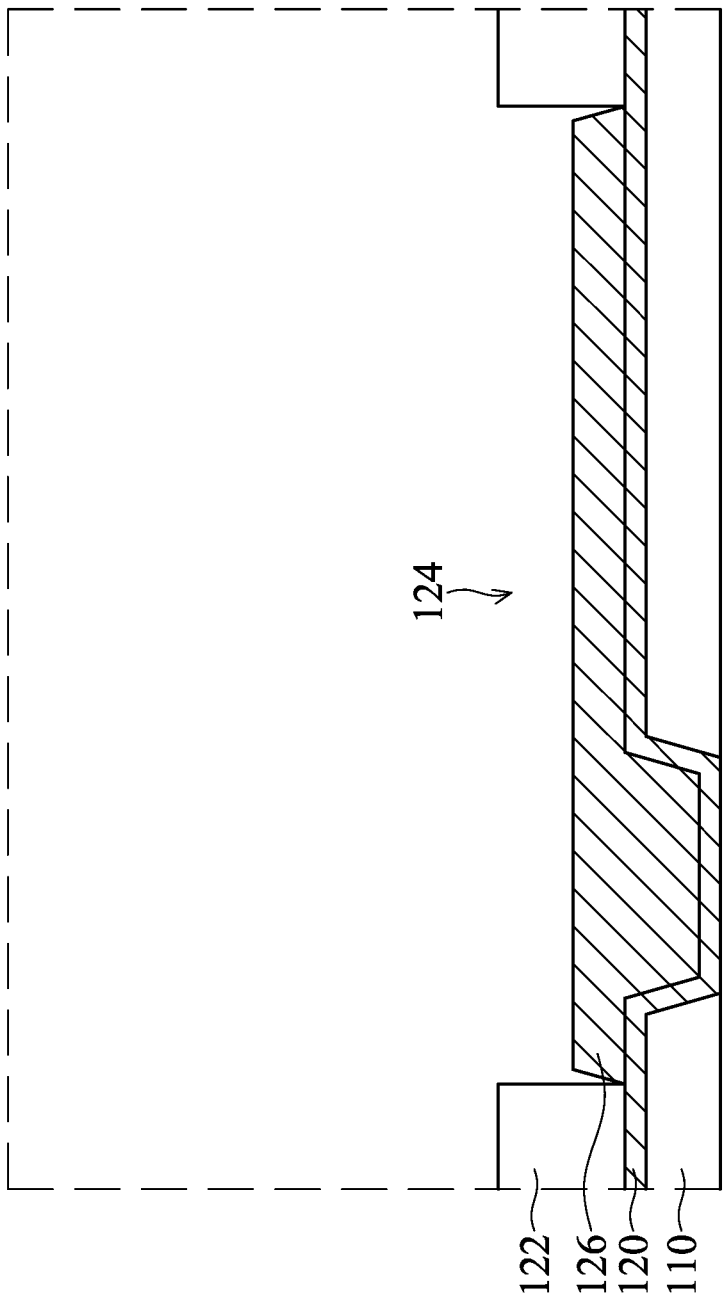

In FIG. 6B, a conductive material 126 is formed in the openings 124 of the first mask 122 and on the exposed portions of the seed layer 120. The conductive material 126 may be a metal, such as copper, titanium, tungsten, aluminum, or the like, which may be formed by plating, such as electroless plating or electroplating, or the like. In some embodiments, the conductive material 126 is a metal that is plated using the seed layer 120.

In some embodiments, the conductive material 126 is formed by an electroplating process. Specifically, the conductive material 126 is formed by submerging the seed layer 120 in a plating solution. The plating solution may be, e.g., a sulfuric acid electrolyte. The plating solution includes cations of the conductive material 126. An electric current is applied to the plating solution to reduce the cations and thereby form the conductive material 126.

In the illustrated embodiment, the conductive material 126 has sidewalls that taper inward. As such, a width of the conductive material 126 decreases in a direction away from the seed layer 120. The sidewalls may be substantially straight (within process variations), such that the conductive material 126 has a trapezoidal shape. The conductive material 126 may be formed with inwardly-tapered sidewalls by initially plating the lower portion of the conductive material 126 at a low plating speed, and then subsequently plating the upper portion of the conductive material 126 with a high plating speed. The electroplating process may be performed with a low plating speed by plating with a low plating current density, and the electroplating process may be performed with a high plating speed by plating with a high plating current density.

Figure 6C:
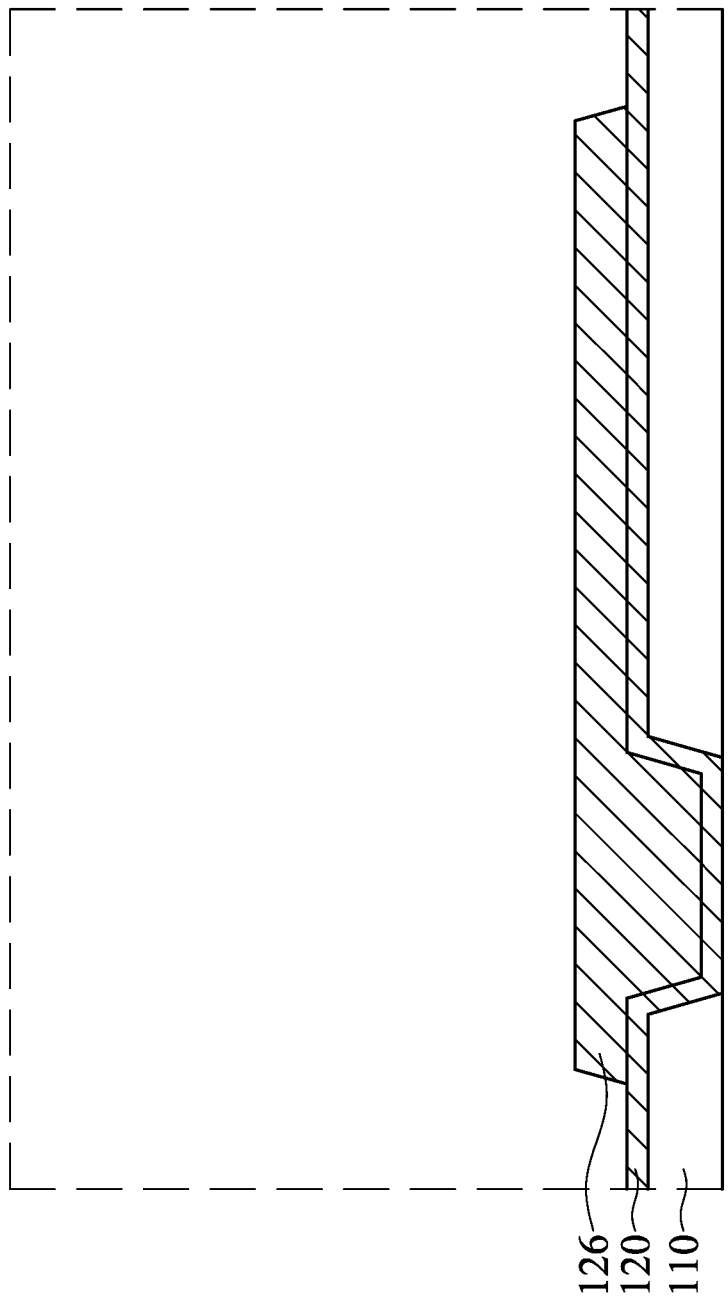

In FIG. 6C, the first mask 122 is removed. In embodiments where the first mask 122 is a photoresist, it may be removed by an acceptable ashing or stripping process, such as using an oxygen plasma or the like. After the first mask 122 is removed, exposed portions of the seed layer 120 may optionally be removed, such as by using an acceptable etching process, such as by wet or dry etching. In the illustrated embodiment, the seed layer 120 is not removed at this step of processing, and instead is removed in a subsequent processing step.

Figure 6D:
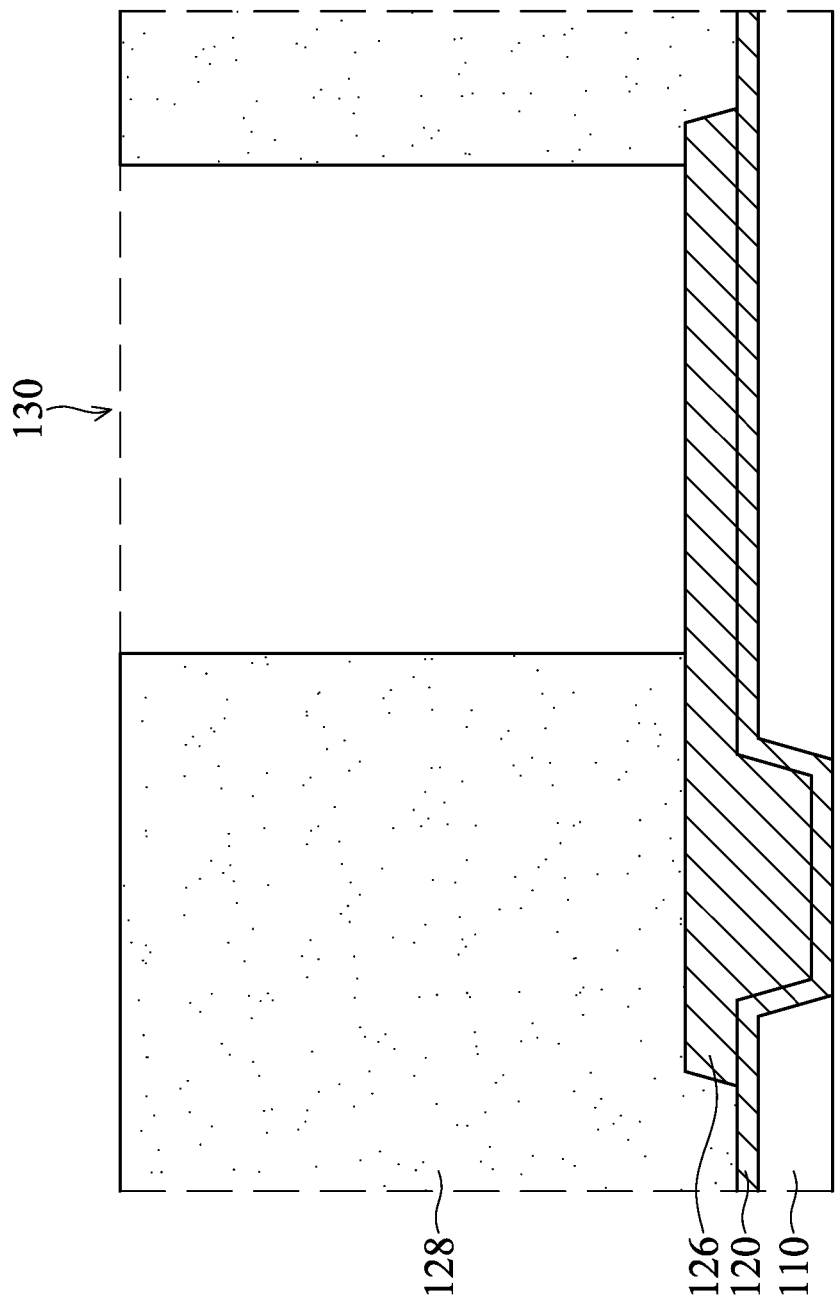

In FIG. 6D, a second mask 128 is formed and patterned on the conductive material 126 and the seed layer 120. The second mask 128 may be a photoresist formed by spin coating or the like and may be exposed to light for patterning. The pattern of the second mask 128 corresponds to the through vias 116 (see FIG. 6H). The patterning forms openings 130 through the second mask 128 to expose the conductive material 126. The second mask 128 has straight sidewalls defining the openings 130, where the straight sidewalls are perpendicular to a major surface of the second mask 128.

Figure 6E:
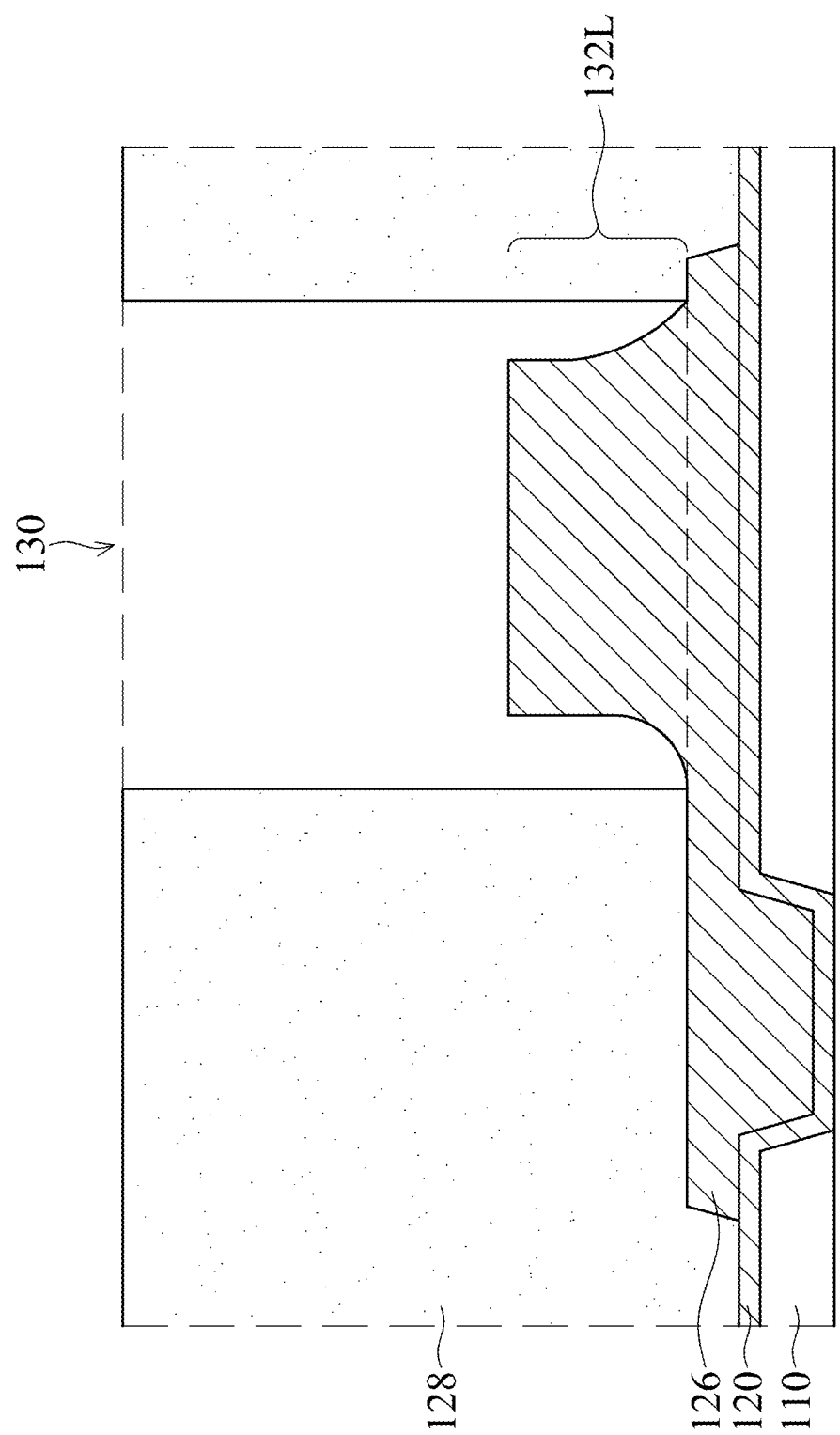
Figure 6F:
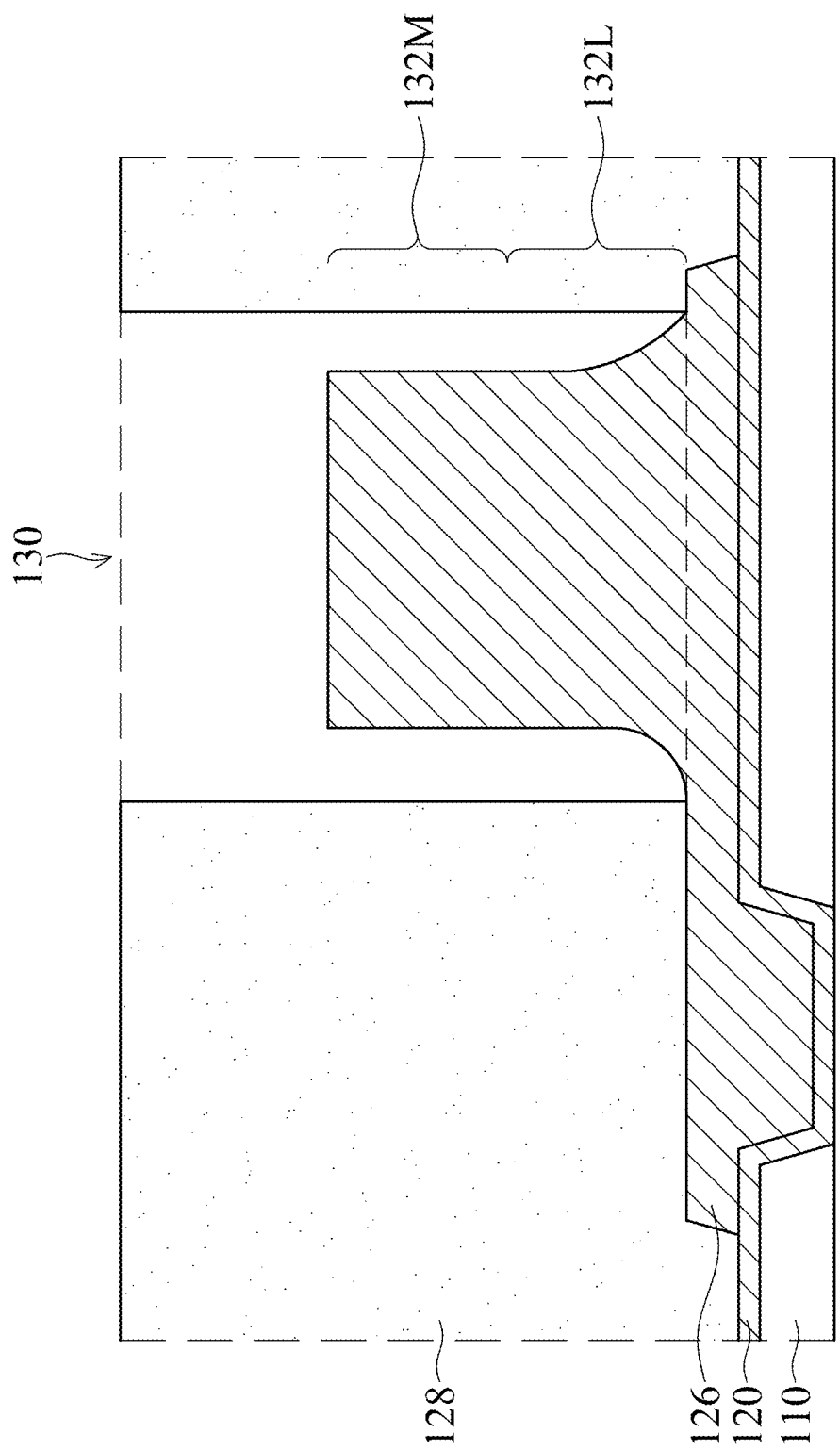
Figure 6G:
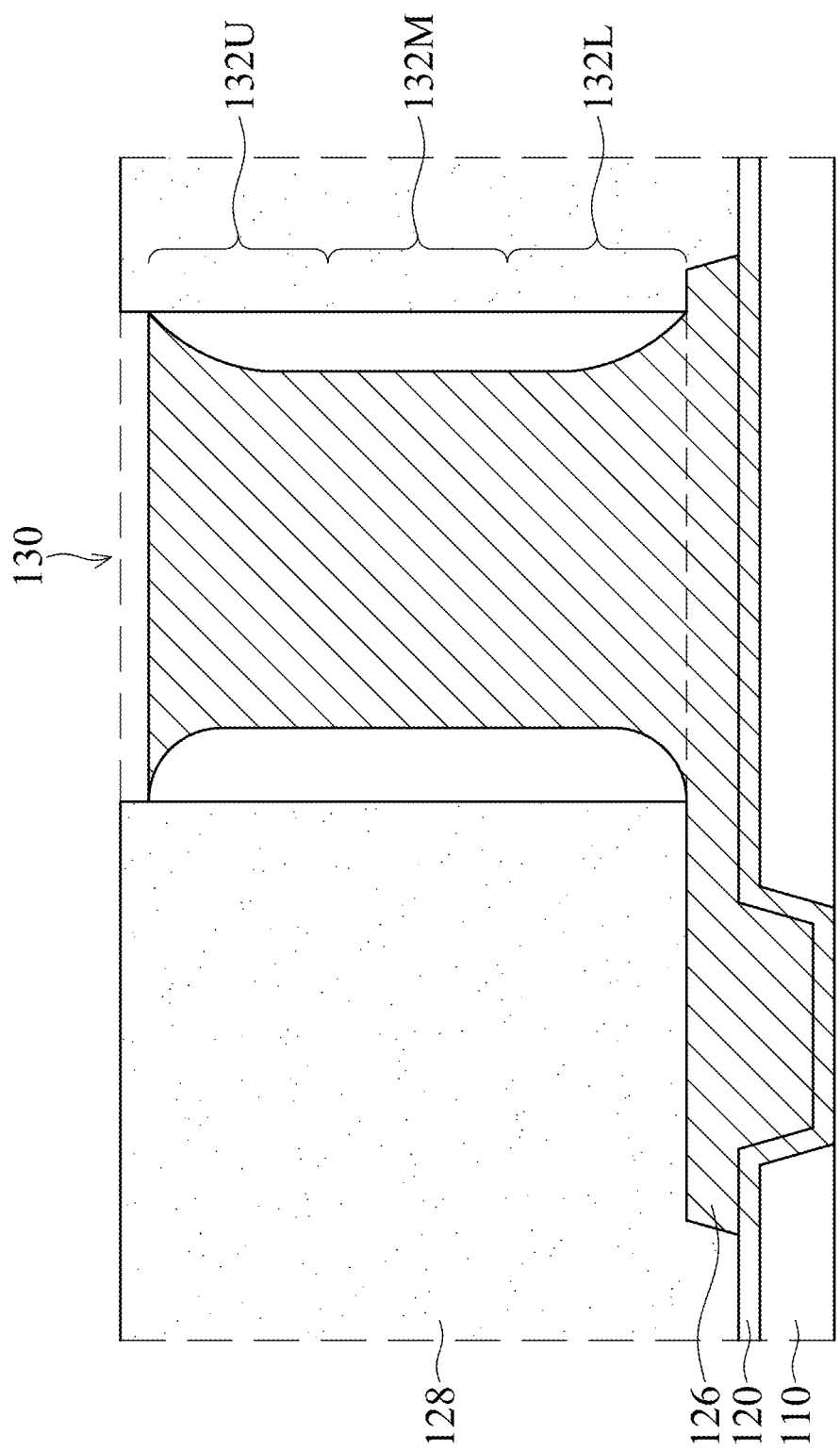
Figure 6H:
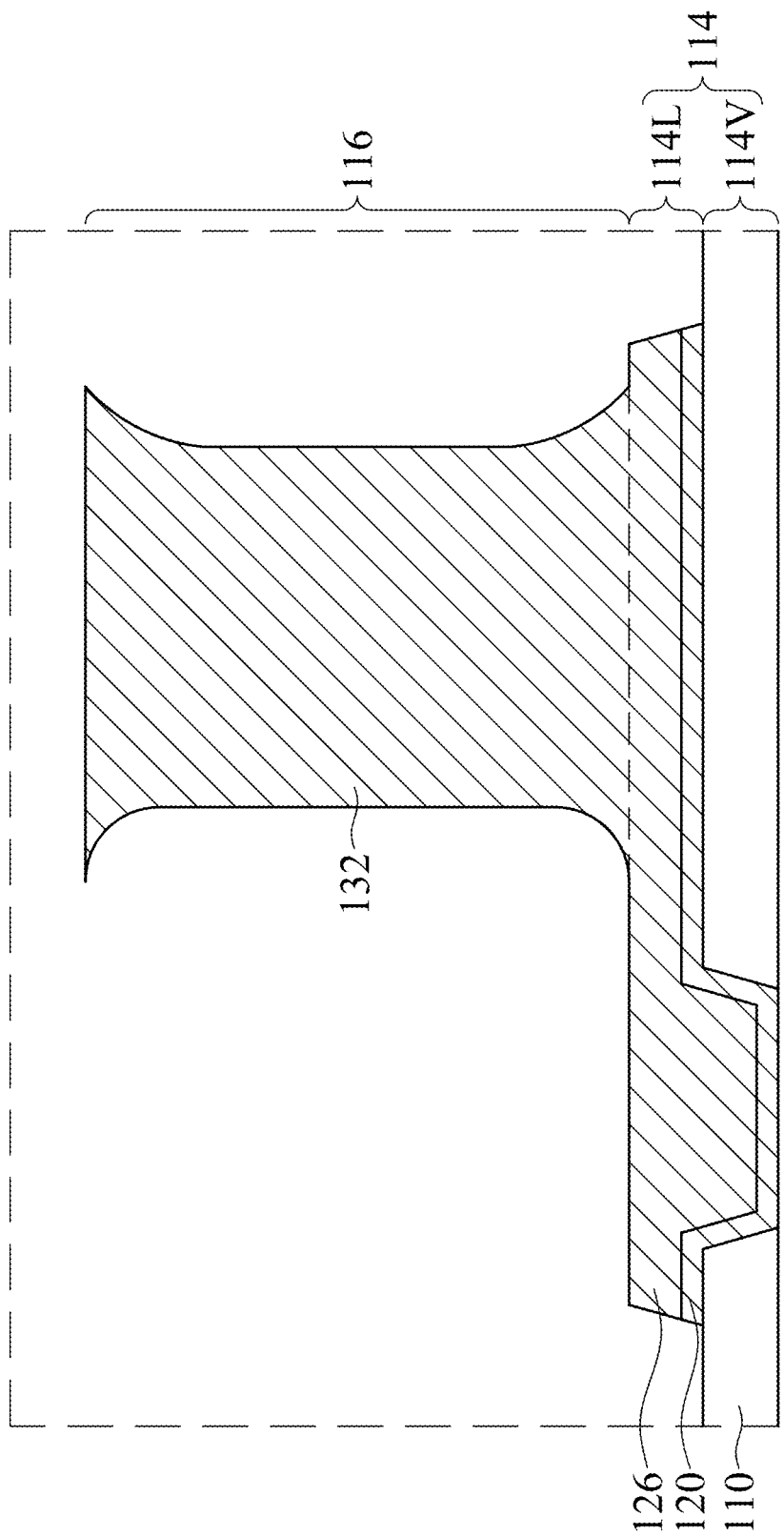

FIGS. 6E-6G illustrate the formation of a conductive material 132 for the through vias 116 (see FIG. 6H). The conductive material 132 may be a metal, such as copper, titanium, tungsten, aluminum, or the like, which may be formed by plating, such as electroless plating or electroplating, or the like. In the illustrated embodiment, the conductive material 132 is the same metal as the conductive material 126, and is plated using the seed layer 120. In such embodiments, no seed layers are disposed between the conductive material 126, 132 such that the conductive material 126, 132 is a same, single continuous metal.

In some embodiments, the conductive material 132 is formed by an electroplating process. Specifically, the conductive material 132 is formed by submerging the conductive material 126 in a plating solution. The plating solution may be, e.g., a sulfuric acid electrolyte. The plating solution includes cations of the conductive material 132. An electric current is applied to the plating solution to reduce the cations and thereby form the conductive material 132. As will be subsequently described in greater detail, a plurality of plating speeds will be utilized to plate the lower, middle, and upper portions of the conductive material 132, thereby causing the conductive material 132 to have concave sidewalls. The workpiece under processing may be vertically oriented when the conductive material 126 is submerged in the plating solution. Due to gravitational forces, the lower portion of the plating solution may have a greater concentration of the cations than the upper portion of the plating solution, and so the conductive material 132 may be asymmetrically plated when the workpiece is vertically oriented. Alternatively, the workpiece under processing may be horizontally oriented when the conductive material 126 is submerged in the plating solution. The conductive material 132 may be symmetrically plated when the workpiece is horizontally oriented.

In FIG. 6E, a lower portion of the conductive material 132L is formed in the openings 130 of the second mask 128 and on the exposed portion of the conductive material 126. The conductive material 132L has sidewalls that taper inward. As such, a width of the conductive material 132L decreases in a direction away from the seed layer 120. The inwardly-tapered sidewalls are curved. The conductive material 132L may be formed with inwardly-tapered sidewalls by initially plating the conductive material 132L with a low plating speed, and then subsequently plating the conductive material 132L with a high plating speed. Beginning the electroplating process with a low plating speed and then transitioning to a high plating speed reduces the plating conformality of the electroplating process in the openings 130, thereby forming the conductive material 132L with inwardly-tapered sidewalls. The electroplating process may be performed with a low plating speed by plating with a low plating current density, and the electroplating process may be performed with a high plating speed by plating with a high plating current density. When a lower plating speed is utilized, the plating may be performed for a longer duration so that the conductive material 132L is sufficiently thick. In some embodiments, the conductive material 132L is plated with a plating current density in the range of 8 A/dm$^2$ to 12 A/dm$^2$ for a duration in the range of 600 seconds to 800 seconds, and is then plated with a plating current density in in the range of 30 A/dm$^2$ to 44 A/dm$^2$ for a duration in the range of 200 seconds to 400 seconds. Plating the conductive material 132L using plating current densities and durations in these ranges allows the conductive material 132L to be formed to a sufficient thickness with inwardly-tapered sidewalls. In some embodiments, the conductive material 132L has a thickness in the range of 15 μm to 25 μm.

In FIG. 6F, a middle portion of the conductive material 132M is formed in the openings 130 of the second mask 128 and on the lower portion of the conductive material 132L. The conductive material 132M has sidewalls that are substantially straight (within process variations), where the straight sidewalls are perpendicular to a major surface of the seed layer 120. As such, a width of the conductive material 132M is constant in a direction away from the seed layer 120. The conductive material 132M may be formed with straight sidewalls by plating the conductive material 132M with a medium plating speed. The medium plating speed used to plate the conductive material 132M may be faster than the low plating speed used to plate the conductive material 132L, and may be slower than the high plating speed used to plate the conductive material 132L. The conductive material 132M may be plated with a medium plating speed by plating with a medium plating current density. In some embodiments, the conductive material 132M is plated with a plating current density in the range of 25 A/dm$^2$ to 30 A/dm$^2$ for a duration in the range of 600 seconds to 800 seconds. Plating the conductive material 132M using a plating current density and duration in these ranges allows the conductive material 132M to be formed to a sufficient thickness with straight sidewalls. In some embodiments, the conductive material 132M has a thickness in the range of 35 μm to 45 μm.

In FIG. 6G, an upper portion of the conductive material 132U is formed in the openings 130 of the second mask 128 and on the middle portion of the conductive material 132M. The conductive material 132U has sidewalls that taper outward. As such, a width of the conductive material 132U increases in a direction away from the seed layer 120. The outwardly-tapered sidewalls are curved. The conductive material 132U may be formed with outwardly-tapered sidewalls by initially plating the conductive material 132U with a high plating speed, and then subsequently plating the conductive material 132U with a low plating speed. The medium plating speed used to plate the conductive material 132M may be faster than the low plating speed used to plate the conductive material 132U, and may be slower than the high plating speed used to plate the conductive material 132U. Beginning the electroplating process with a high plating speed and then transitioning to a low plating speed increases the plating conformality of the electroplating process in the openings 130, thereby forming the conductive material 132U with outwardly-tapered sidewalls. The electroplating process may be performed with a high plating speed by plating with a high plating current density, and the electroplating process may be performed with a low plating speed by plating with a low plating current density. When a lower plating speed is utilized, the plating may be performed for a longer duration so that the conductive material 132U is sufficiently thick. In some embodiments, the conductive material 132U is plated with a plating current density in the range of 30 A/dm$^2$ to 44 A/dm$^2$ for a duration in the range of 200 seconds to 400 seconds, and is then plated with a plating current density in the range of 8 A/dm$^2$ to 12 A/dm$^2$ for a duration in the range of 600 seconds to 1000 seconds. Plating the conductive material 132U using plating current densities and durations in these ranges allows the conductive material 132U to be formed to a sufficient thickness with outwardly-tapered sidewalls. In some embodiments, the conductive material 132U has a thickness in the range of 15 μm to 25 μm.

In FIG. 6H, the second mask 128 and exposed portions of the seed layer 120 are removed. The exposed portions of the seed layer 120 are those portions on which the conductive material 126 is not formed. In embodiments where the second mask 128 is a photoresist, it may be removed by an acceptable ashing or stripping process, such as using an oxygen plasma or the like. After the second mask 128 is removed, exposed portions of the seed layer 120 are removed, such as by using an acceptable etching process, such as by wet or dry etching. The remaining portions of the seed layer 120 and the conductive material 126 form the UBMLs 114 (which have trapezoidal shapes). The remaining portions of the conductive material 132 form the through vias 116 (which have hourglass shapes).

As noted above, the UBMLs 114 have line portions 114L on and extending along the major surface of the dielectric layer 110, and have via portions 114V extending through the dielectric layer 110. Each through via 116 is formed on a line portion 114L of an underlying UBML 114. In this embodiment, each through via 116 is laterally offset from the via portion 114V of the underlying UBML 114, such that the through via 116 is not aligned with the via portion 114V. In other embodiments (subsequently described for FIGS. 16-19), each through via 116 is aligned with the via portion 114V of the underlying UBML 114, such that the through via 116 is not laterally offset from the via portion 114V.

Figure 7:
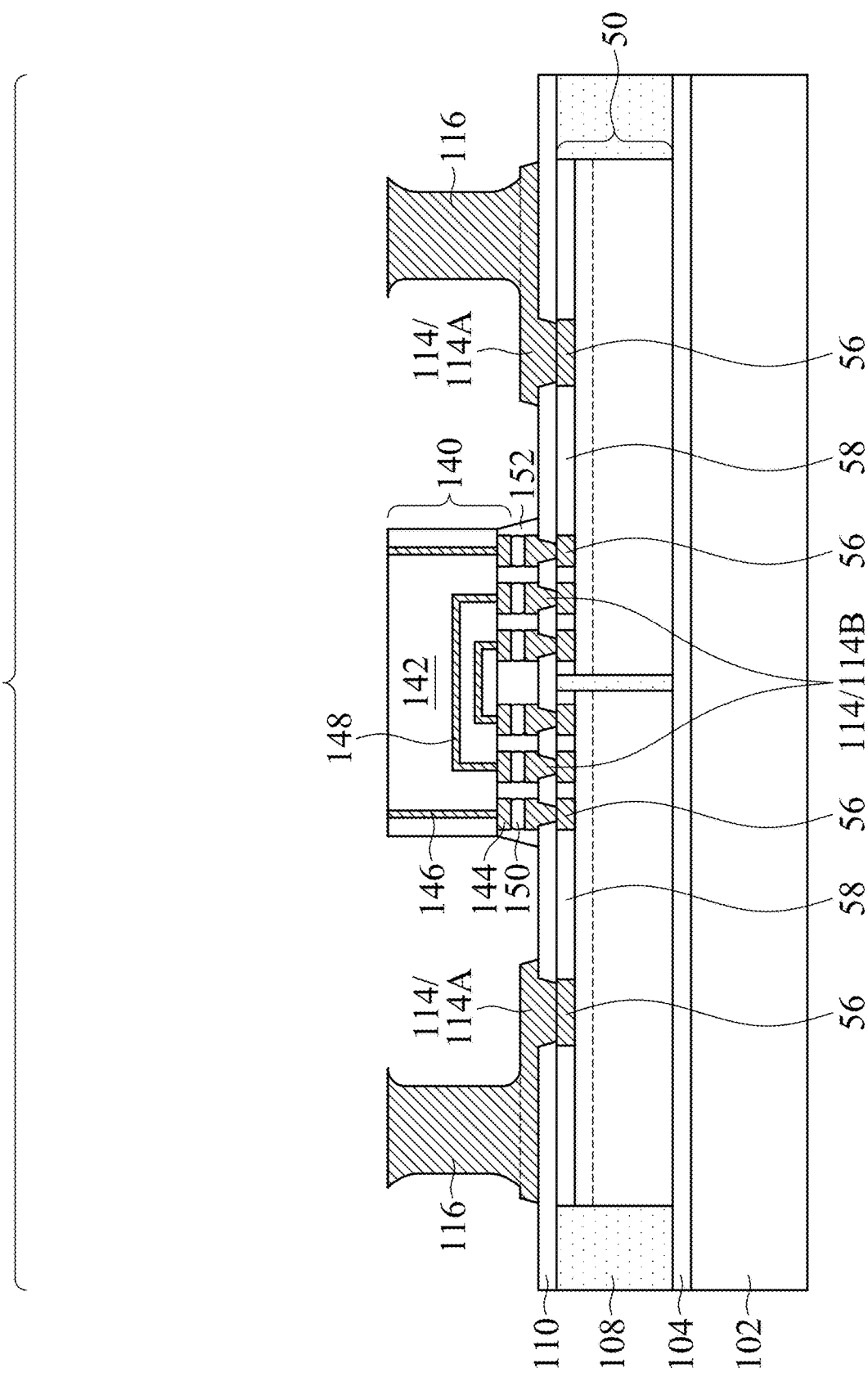

In FIG. 7, one or more semiconductor die(s), such as an interconnection die 140, are attached to the UBMLs 114B. The interconnection die 140 may be a local silicon interconnect (LSI), a large scale integration package, an interposer die, or the like. In the embodiment shown, one interconnection die 140 is attached to the UBMLs 114B in the package region 102A. It should be appreciated that any desired quantity of interconnection dies 140 may be placed in the package region 102A. The interconnection die 140 may be placed by, e.g., a pick-and-place process. The interconnection die 140 includes a substrate 142, with conductive features formed in and/or on the substrate 142. The substrate 142 may include a semiconductor substrate, one or more dielectric layer(s), or the like. The interconnection die 140 is attached to the UBMLs 114B using die connectors 144 disposed at the front side of the interconnection die 140. Some of the die connectors 144 may be electrically coupled to the back side of the interconnection die 140 with through-substrate vias (TSVs) 146 that extend into or through the substrate 142. In the illustrated embodiment, the TSVs 146 extend through the substrate 142 so that they are exposed at the back sides of the interconnection die 140. In another embodiment, a material of the substrate 142 may cover the TSVs 146.

In embodiments where the interconnection die 140 is an LSI, the interconnection die 140 may be a bridge structure that includes die bridges 148. The die bridges 148 may be metallization layers formed in and/or on, e.g., the substrate 142, and work to interconnect each die connector 144 to another die connector 144. As such, the LSI can be used to directly connect and allow communication between the integrated circuit dies 50 (e.g., the integrated circuit dies 50A, 50B, see FIG. 3). In such embodiments, the interconnection die 140 can be placed over a region that is disposed between the integrated circuit dies 50 so that each of the interconnection die 140 overlaps the underlying integrated circuit dies 50. In some embodiments, the interconnection die 140 may further include logic devices and/or memory devices.

Conductive connectors 150 are formed on the UBMLs 114B and/or the die connectors 144. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. The interconnection die 140 is attached to the UBMLs 114B using the conductive connectors 150. Attaching the interconnection die 140 to the UBMLs 114B may include placing the interconnection die 140 on the UBMLs 114B and reflowing the conductive connectors 150 to physically and electrically couple the die connectors 144 to the UBMLs 114B.

In some embodiments, an underfill 152 is formed around the conductive connectors 150, and between the dielectric layer 110 and the interconnection die 140. The underfill 152 may reduce stress and protect the joints resulting from the reflowing of the conductive connectors 150. The underfill 152 may also be included to securely bond the interconnection die 140 to the dielectric layer 110 and provide structural support and environmental protection. The underfill 152 may be formed of a molding compound, epoxy, or the like.

The underfill 152 may be formed by a capillary flow process after the interconnection die 140 is attached, or may be formed by a suitable deposition method before the interconnection die 140 is attached. The underfill 152 may be applied in liquid or semi-liquid form and then subsequently cured.

Figure 8:
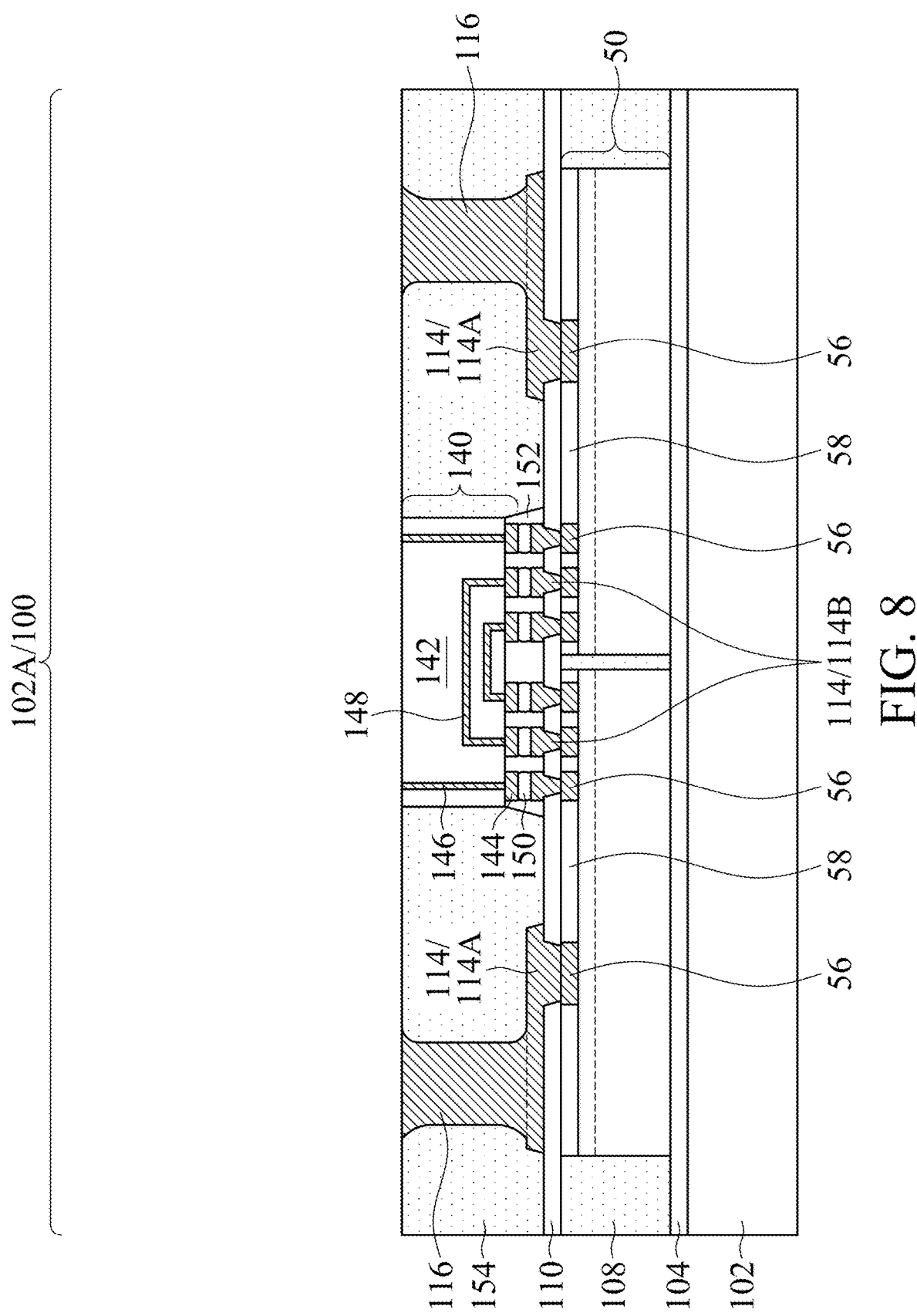

In FIG. 8, an encapsulant 154 is formed around the UBMLs 114, the through vias 116, the interconnection die 140, and the underfill 152 (if present) or the conductive connectors 150. After formation, the encapsulant 154 encapsulates the UBMLs 114, the through vias 116, the interconnection die 140, and the underfill 152 (if present) or the conductive connectors 150. The encapsulant 154 may be a molding compound, epoxy, or the like. The encapsulant 154 may be applied by compression molding, transfer molding, or the like, and may be dispensed on the dielectric layer 110, the UBMLs 114, the through vias 116, the interconnection die 140 such that the interconnection die 140 and the through vias 116 are buried or covered. The encapsulant 154 is further dispensed in gap regions between the interconnection die 140 and the through vias 116. The encapsulant 154 may be applied in liquid or semi-liquid form and then subsequently cured. A removal process may be performed on the encapsulant 154 to expose the TSVs 146 and the through vias 116. The removal process may remove material of the encapsulant 154, the interconnection die 140 (e.g., the TSVs 146 and the substrate 142), and the through vias 116 until the TSVs 146 and the through vias 116 are exposed. The removal process may be, for example, planarization process such as a chemical-mechanical polish (CMP), a grinding process, or the like. After the planarization process, top surfaces of the encapsulant 154, the interconnection die 140 (e.g., the TSVs 146 and the substrate 142), and the through vias 116 are substantially coplanar (within process variations). In some embodiments, the removal process may be omitted, for example, if the TSVs 146 and the through vias 116 are already exposed.

Figure 9:
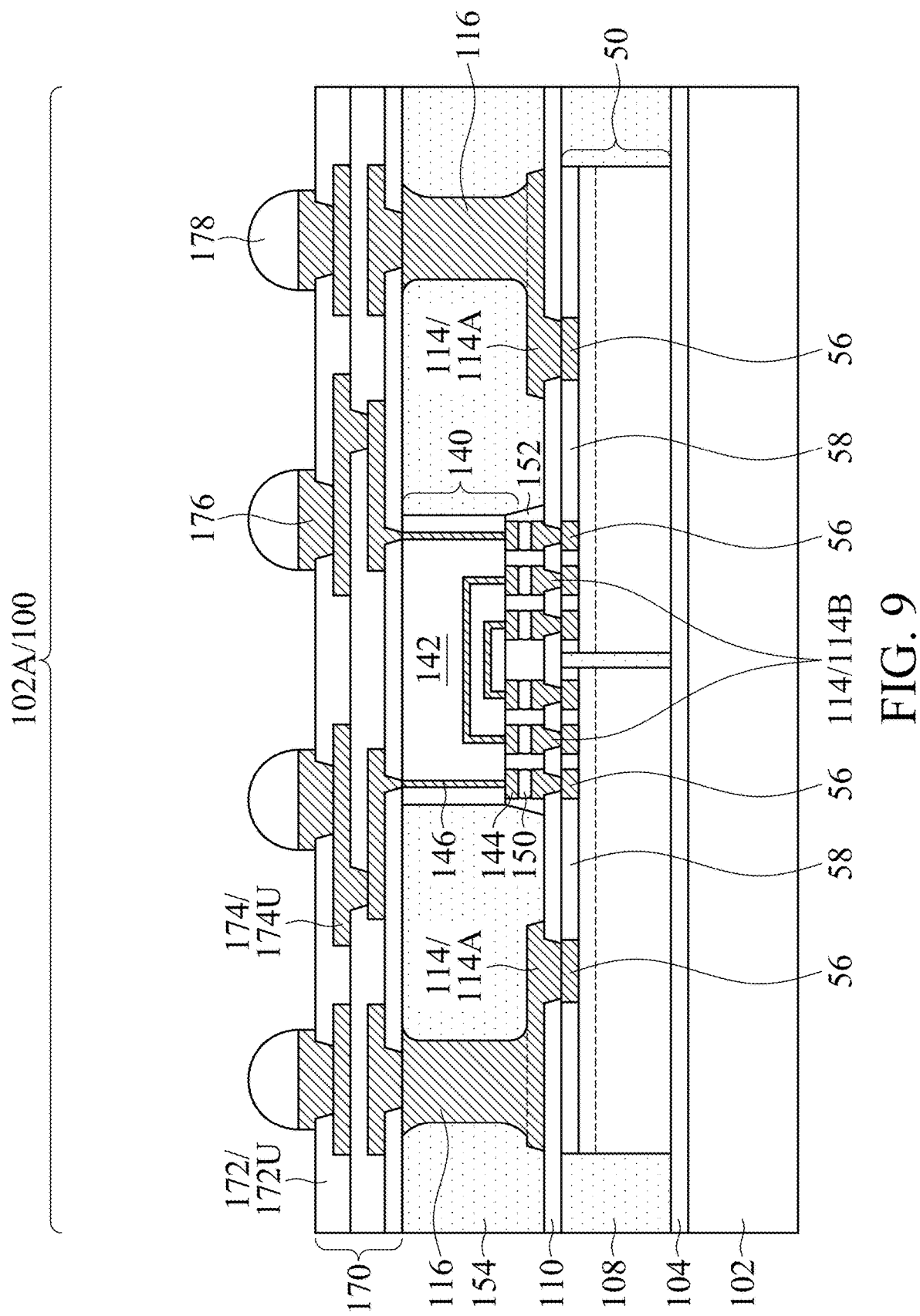

In FIG. 9, a redistribution structure 170 is formed on the top surfaces of the encapsulant 154, the interconnection die 140 (e.g., the TSVs 146 and the substrate 142), and the through vias 116. The redistribution structure 170 includes dielectric layers 172 and metallization layers 174 (sometimes referred to as redistribution layers or redistribution lines) among the dielectric layers 172. For example, the redistribution structure 170 may include a plurality of metallization layers 174 separated from each other by respective dielectric layers 172. The metallization layers 174 of the redistribution structure 170 are electrically coupled to the integrated circuit dies 50 by the through vias 116 and the interconnection die 140 (e.g., the TSVs 146).

In some embodiments, the dielectric layers 172 are formed of a polymer, which may be a photo-sensitive material such as PBO, polyimide, a BCB-based polymer, or the like. In other embodiments, the dielectric layers 172 are formed of a nitride such as silicon nitride; an oxide such as silicon oxide, PSG, BSG, BPSG; or the like. The dielectric layers 172 may be formed by spin coating, lamination, CVD, the like, or a combination thereof. After each dielectric layer 172 is formed, it is then patterned to form openings exposing underlying conductive features, such as portions of the underlying through vias 116, TSVs 146, or metallization layers 174. The patterning may be by an acceptable process, such as by exposing the dielectrics layers to light when the dielectric layers 172 are a photo-sensitive material, or by etching using, for example, an anisotropic etch. If the dielectric layers 172 are photo-sensitive materials, the dielectric layers 172 can be developed after the exposure.

The metallization layers 174 include conductive vias and conductive lines. The conductive vias extend through respective dielectric layers 172, and the conductive lines extend along respective dielectric layers 172. As an example to form a metallization layer 174, a seed layer (not illustrated) is formed over the respective underlying features. For example, the seed layer can be formed on a respective dielectric layer 172 and in the openings through the respective dielectric layer 172. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form a metallization layer 174 for one level of the redistribution structure 170.

The redistribution structure 170 is illustrated as an example. More or fewer dielectric layers 172 and metallization layers 174 than illustrated may be formed in the redistribution structure 170 by repeating or omitting the steps previously described.

Under-bump metallizations (UBMs) 176 are formed for external connection to the front-side redistribution structure 170. The UBMs 176 have bump portions on and extending along the major surface of the upper dielectric layer 172U of the redistribution structure 170, and have via portions extending through the upper dielectric layer 172U of the redistribution structure 170 to physically and electrically couple the upper metallization layer 174U of the redistribution structure 170. As a result, the UBMs 176 are electrically coupled to the through vias 116 and the interconnection die 140 (e.g., the TSVs 146). The UBMs 176 may be formed of the same material as the metallization layers 174, and may be formed by a similar process as the metallization layers 174. In some embodiments, the UBMs 176 have a different (e.g., larger) size than the metallization layers 174.

Conductive connectors 178 are formed on the UBMs 176. The conductive connectors 178 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 178 may include a conductive material such as solder, copper, aluminum, gold, nickel, silver, palladium, tin, the like, or a combination thereof. In some embodiments, the conductive connectors 178 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 178 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 10:
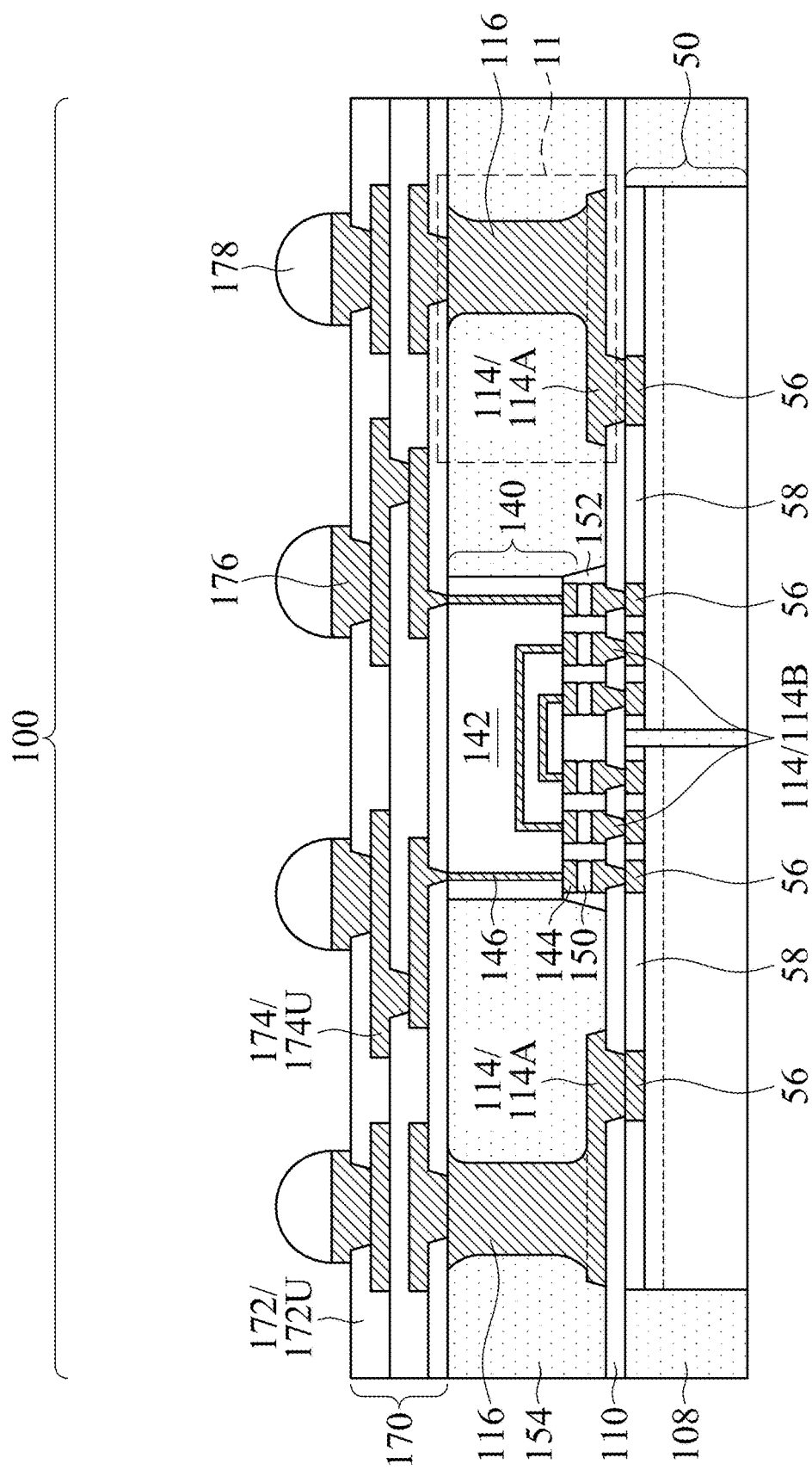

In FIG. 10, a carrier substrate debonding is performed to detach (or "debond") the carrier substrate 102 from the integrated circuit dies 50 and the encapsulant 108. In some embodiments, the debonding includes projecting a light such as a laser light or an UV light on the release layer 104 so that the release layer 104 decomposes under the heat of the light and the carrier substrate 102 can be removed.

Additional processing may be performed to complete formation of the integrated circuit package 100. For example, the package region 102A may be singulated to form the integrated circuit package 100. The singulation process may include sawing along scribe line regions, e.g., between the package region 102A and adjacent package regions. The sawing singulates the package region 102A from the adjacent package regions, and the resulting integrated circuit package 100 is from the package region 102A.

Figure 11:
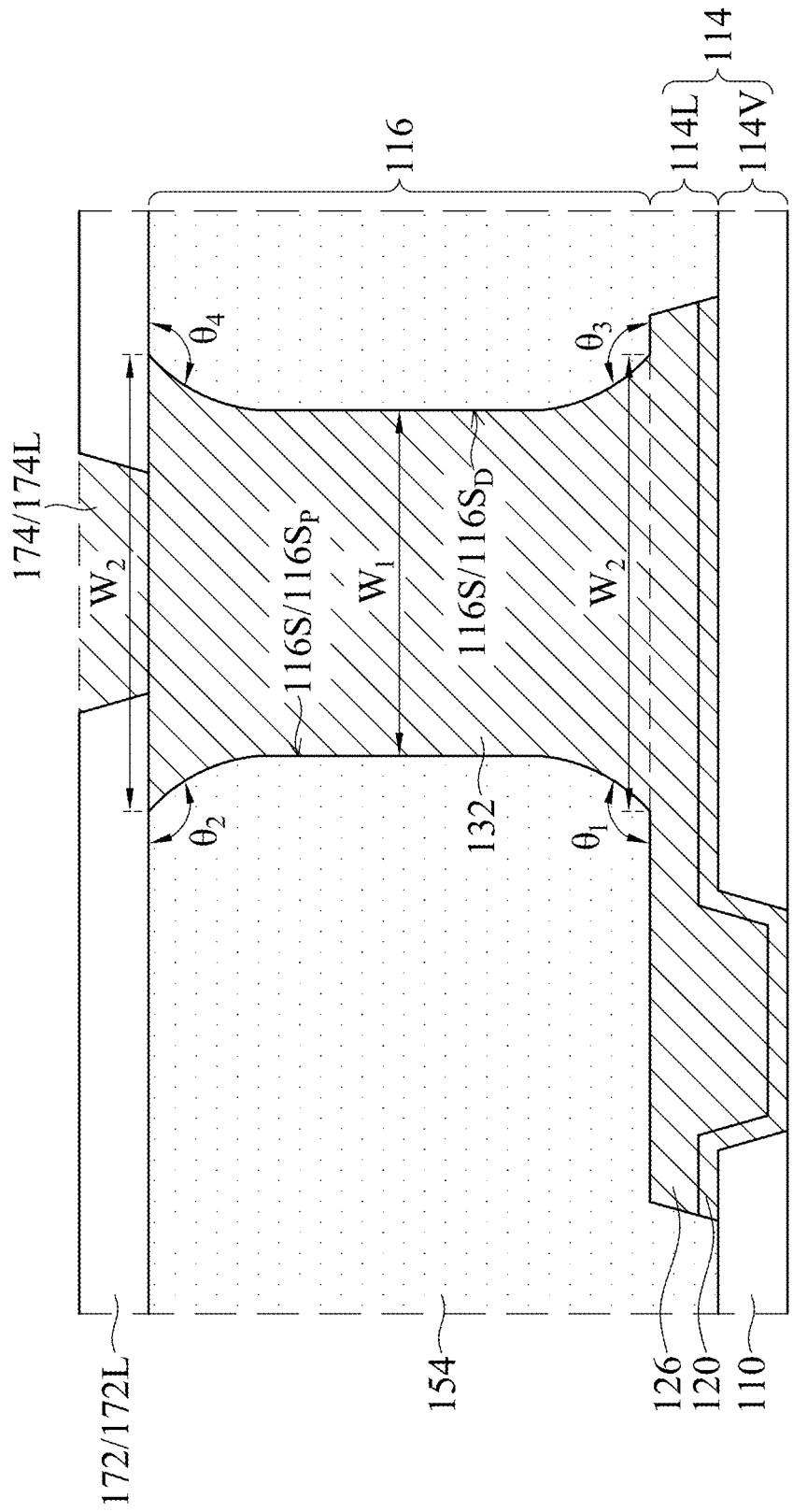
FIG. 11 is a cross-sectional view of an integrated circuit package, in accordance with some embodiments.

FIG. 11 is a cross-sectional view of an integrated circuit package 100, in accordance with some embodiments. Details in a region 11 of FIG. 10 are illustrated. Specifically, a through via 116 and an underlying UBML 114 are shown.

The through via 116 has curved sidewalls 116S. Stress can be generated in a package during testing or use, such as due to a coefficient of thermal expansion (CTE) mismatch between the materials of the through via 116 and the encapsulant 154. Advantageously, the curved sidewalls 116S reduce or disperse stress better than straight sidewalls, helping reduce the concentrate of stress on the curved sidewalls 116S of the through via 116. Forming the through via 116 with curved sidewalls 116S can reduce the amount of stress that concentrates on the interface between the through via 116 and the encapsulant 154, reducing the risk of the encapsulant 154 delaminating from the through via 116. Additionally or alternatively, forming the through via 116 with curved sidewalls 116S can reduce the amount of stress that concentrates on the junction between the through via 116 and the UBML 114, reducing the risk of cracks forming between the through via 116 and the UBML 114. The reliability of the resulting package may thus be increased.

In this embodiment, the curved sidewalls 116S are concave sidewalls, such that the through via 116 has an hourglass shape. As a result of the hourglass shape, the through via 116 has multiple widths (also referred to as "critical dimensions"). The center portion of the through via 116 has a first width $W_1$, and the end portions of the through via 116 each have a second width $W_2$, with the second width $W_2$ being greater than the first width $W_1$. The end portions of the through via 116 include a first end portion (which is physically and electrically coupled to the UBML 114) and a second portion (which is physically and electrically coupled to the lower metallization layer 174L of the redistribution structure 170). In some embodiments, the first width $W_1$ is about 150 μm (such as in the range of 145 μm to 155 μm) and the second width $W_2$ is about 135 μm (such as in the range of 130 μm to 140 μm). A width of the through via 116 decreases in a direction towards the UBML 114 until a point, and then increases in that direction.

As noted above, the through via 116 may be laterally offset from the via portion 114V of the underlying UBML 114. The through via 116 has a proximal sidewall 116S$_P$, which faces towards the via portion 114V of the UBML 114, and thus faces towards a respective die connector 56 (see FIG. 10) connected to the via portion 114V of the UBML 114. The through via 116 also has a distal sidewall 116S$_D$, which faces away from the via portion 114V of the UBML 114, and thus faces away from the die connector 56 (see FIG. 10) connected to the via portion 114V of the UBML 114. Put another way, a proximal sidewall 116S$_P$ of a through via 116 is proximate a respective die connector 56, and a distal sidewall 116S$_D$ of the through via 116 is distal the respective die connector 56, such that the proximal sidewall 116S$_P$ is closer to the die connector 56 than the distal sidewall 116S$_D$. The proximal sidewall 116S$_P$ is at a first interface between the through via 116 and the encapsulant 154, such that the first interface is curved. The distal sidewall 116S$_D$ is at a second interface between the through via 116 and the encapsulant 154, such that the second interface is curved. The proximal sidewall 116S$_P$ may face towards a longer segment of the line portion 114L of the UBML 114 than the distal sidewall 116S$_D$, and as a result, the proximal sidewall 116S$_P$ may undergo more stress than the distal sidewall 116S$_D$. The proximal sidewall 116S$_P$ has a longer arc length (or more generally, a different arc length) than the distal sidewall 116S$_D$, which allows the proximal sidewall 116S$_P$ to reduce or disperse more stress than the distal sidewall 116S$_D$. In some embodiments, the proximal sidewall 116S$_P$ has an arc length of about 105 μm (such as in the range of 100 μm to 110 μm) and the distal sidewall 116S$_D$ has an arc length of about 90 μm (such as in the range of 85 μm to 95 μm). The proximal sidewall 116S$_P$ may be formed with a longer arc length than the distal sidewall 116S$_D$ by asymmetrically plating the conductive material 132 (previously described for FIGS. 6E-6G).

Because the curved sidewalls 116S are concave sidewalls, they form obtuse angles with the top surface of the UBML 114 and with the bottom surface of the lower dielectric layer 172L of the redistribution structure 170. The proximal sidewall 116S$_P$ forms a first angle $\theta_1$ with the top surface of the UBML 114, and forms a second angle $\theta_2$ with the bottom surface of the lower dielectric layer 172L. The distal sidewall 116S$_D$ forms a third angle $\theta_3$ with the top surface of the UBML 114, and forms a fourth angle $\theta_4$ with the bottom surface of the lower dielectric layer 172L. The angles $\theta_1$, $\theta_2$, $\theta_3$, $\theta_4$ are each in the range of 90 degrees to 120 degrees. Forming any of the angles $\theta_1$, $\theta_2$, $\theta_3$, $\theta_4$ to be more than 120 degrees may cause the first width $W_1$ of the through via 116 to be too small, thereby reducing the structural strength of the through via 116. The first angle $\theta_1$ may be equal to the second angle $\theta_2$, and the third angle $\theta_3$ may be equal to the fourth angle $\theta_4$. In embodiments where the proximal sidewall 116S$_P$ has a longer arc length than the distal sidewall 116S$_D$, the first angle $\theta_1$ is greater than the third angle $\theta_3$ and the fourth angle $\theta_4$, and the second angle $\theta_2$ is also greater than the third angle $\theta_3$ and the fourth angle $\theta_4$.

Figure 12:
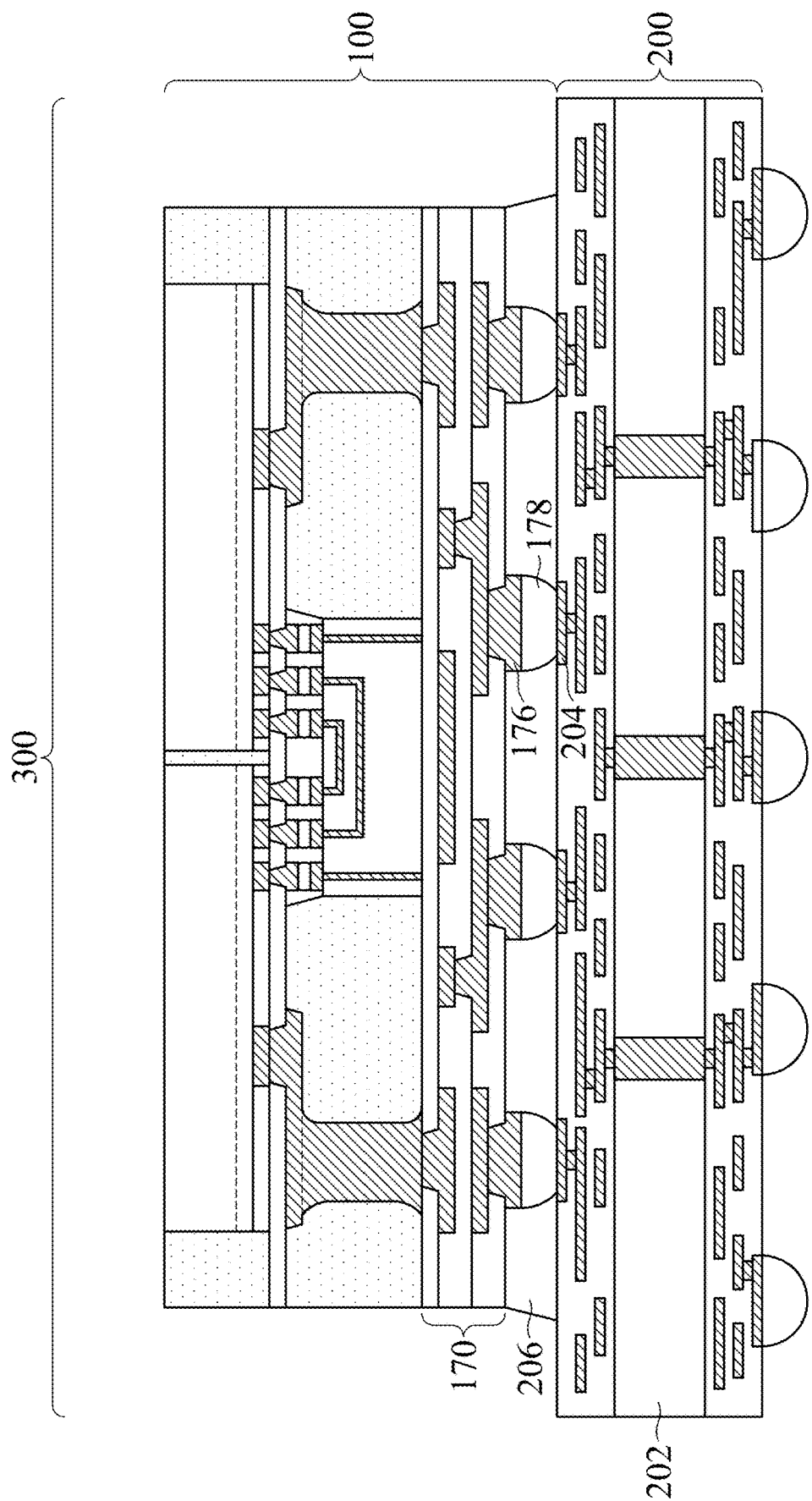
FIG. 12 is a cross-sectional view of an integrated circuit device, in accordance with some embodiments.

FIG. 12 is a cross-sectional view of an integrated circuit device 300, in accordance with some embodiments. The integrated circuit device 300 is formed by bonding an integrated circuit package 100 to a package substrate 200. The bonding process may be, e.g., a flip-chip bonding process.

After the integrated circuit package 100 is formed, it is flipped and attached to a package substrate 200 using the conductive connectors 178. The package substrate 200 may be an interposer, a printed circuit board (PCB), or the like. The package substrate 200 includes a substrate core 202 and bond pads 204 over the substrate core 202. The substrate core 202 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 202 may be a SOI substrate. Generally, an SOI substrate includes a layer of a semiconductor material such as epitaxial silicon, germanium, silicon germanium, SOI, SGOI, or combinations thereof. The substrate core 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build up films such as Ajinomoto Build-up Film (ABF) or other laminates may be used for substrate core 202.

The substrate core 202 may include active and/or passive devices (not separately illustrated). A wide variety of devices such as transistors, capacitors, resistors, combinations of these, and the like may be used to generate the structural and functional designs for the device stack. The devices may be formed using any suitable methods.

The substrate core 202 may also include metallization layers and vias, with the bond pads 204 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 202 is substantially free of active and passive devices.

In some embodiments, the conductive connectors 178 are reflowed to attach the UBMs 176 to the bond pads 204. The conductive connectors 178 physically and/or electrically couple the package substrate 200, including metallization layers in the substrate core 202, to the integrated circuit package 100, including metallization layers in the redistribution structure 170. In some embodiments, a solder resist is formed on the substrate core 202. The conductive connectors 178 may be disposed in openings in the solder resist to be physically and electrically coupled to the bond pads 204. The solder resist may be used to protect areas of the package substrate 200 from external damage.

An underfill 206 may be formed between the integrated circuit package 100 and the package substrate 200, surrounding the conductive connectors 178 to reduce stress and protect the joints resulting from the reflowing the conductive connectors 178. In some embodiments, the underfill 206 is formed by a capillary flow process after the integrated circuit package 100 is attached or is formed by a suitable deposition method before the integrated circuit package 100 is attached. In some embodiments, the conductive connectors 178 have an epoxy flux (not separately illustrated) formed thereon before they are reflowed, with at least some of the epoxy portion of the epoxy flux remaining after the integrated circuit package 100 is attached to the package substrate 200. This remaining epoxy portion may act as the underfill 206.

In some embodiments, passive devices (e.g., surface mount devices (SMDs), not separately illustrated) may also be attached to the integrated circuit package 100 (e.g., to the UBMs 176) or to the package substrate 200 (e.g., to the bond pads 204). For example, the passive devices may be bonded to a same surface of the integrated circuit package 100 or the package substrate 200 as the conductive connectors 178. The passive devices may be attached to the integrated circuit package 100 prior to mounting the integrated circuit package 100 to the package substrate 200, or may be attached to the package substrate 200 after mounting the integrated circuit package 100 to the package substrate 200.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Forming the through vias 116 with curved sidewalls 116S can reduce the amount of stress that concentrates on the respective interfaces between the through vias 116 and the encapsulant 154, reducing the risk of the encapsulant delaminating from the through via 116. Additionally or alternatively, forming the through vias 116 with curved sidewalls 116S can reduce the amount of stress that concentrates on the respective junctions between the through vias 116 and the underlying UBMLs 114, reducing the risk of cracks forming between the through vias 116 and the UBMLs 114. The reliability of the integrated circuit package 100 may thus be increased. In some embodiments, the proximal sidewalls $116S_P$ of the through vias 116 have a greater arc length than the distal sidewalls $116S_D$ of the through vias 116. The proximal sidewalls $116S_P$ may undergo more stress than the distal sidewalls $116S_D$, and forming the proximal sidewalls $116S_P$ with a greater arc length allows the proximal sidewalls $116S_P$ to reduce or disperse more stress than the distal sidewalls $116S_D$.

Figure 13A:
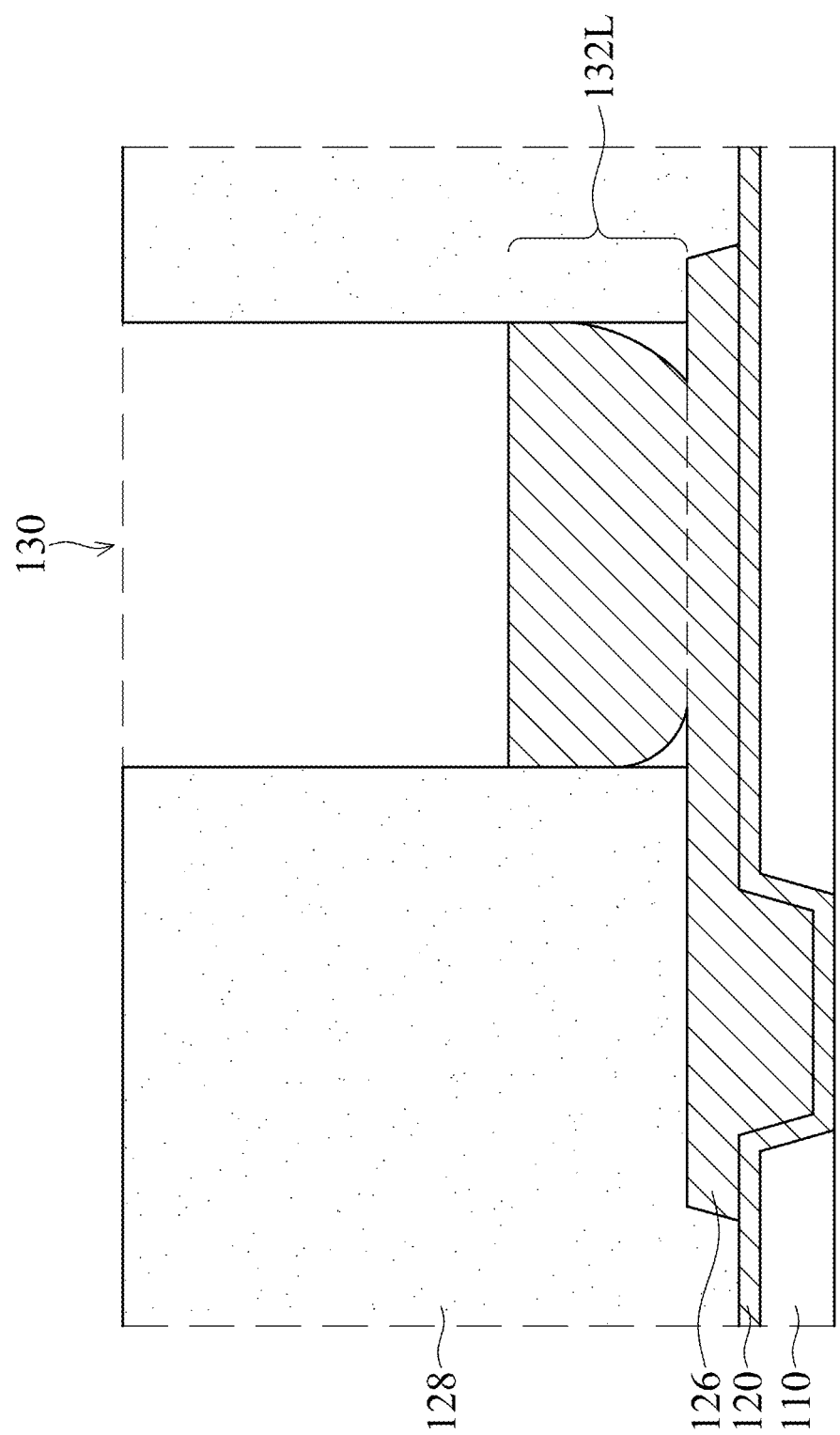
FIGS. 13A-13C are cross-sectional views of intermediate stages in the manufacturing of an integrated circuit package, in accordance with some other embodiments.
Figure 13B:
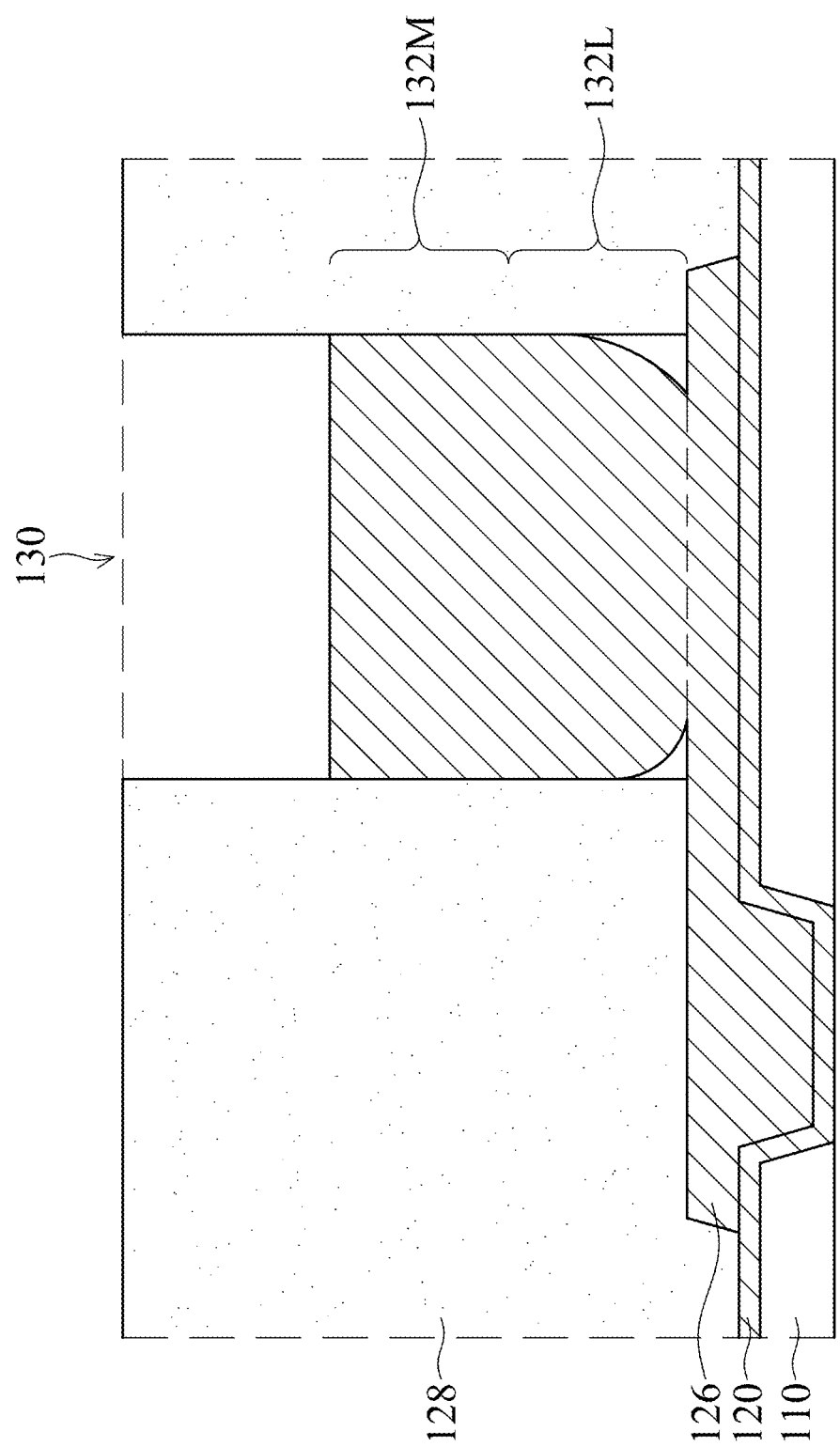
Figure 13C:
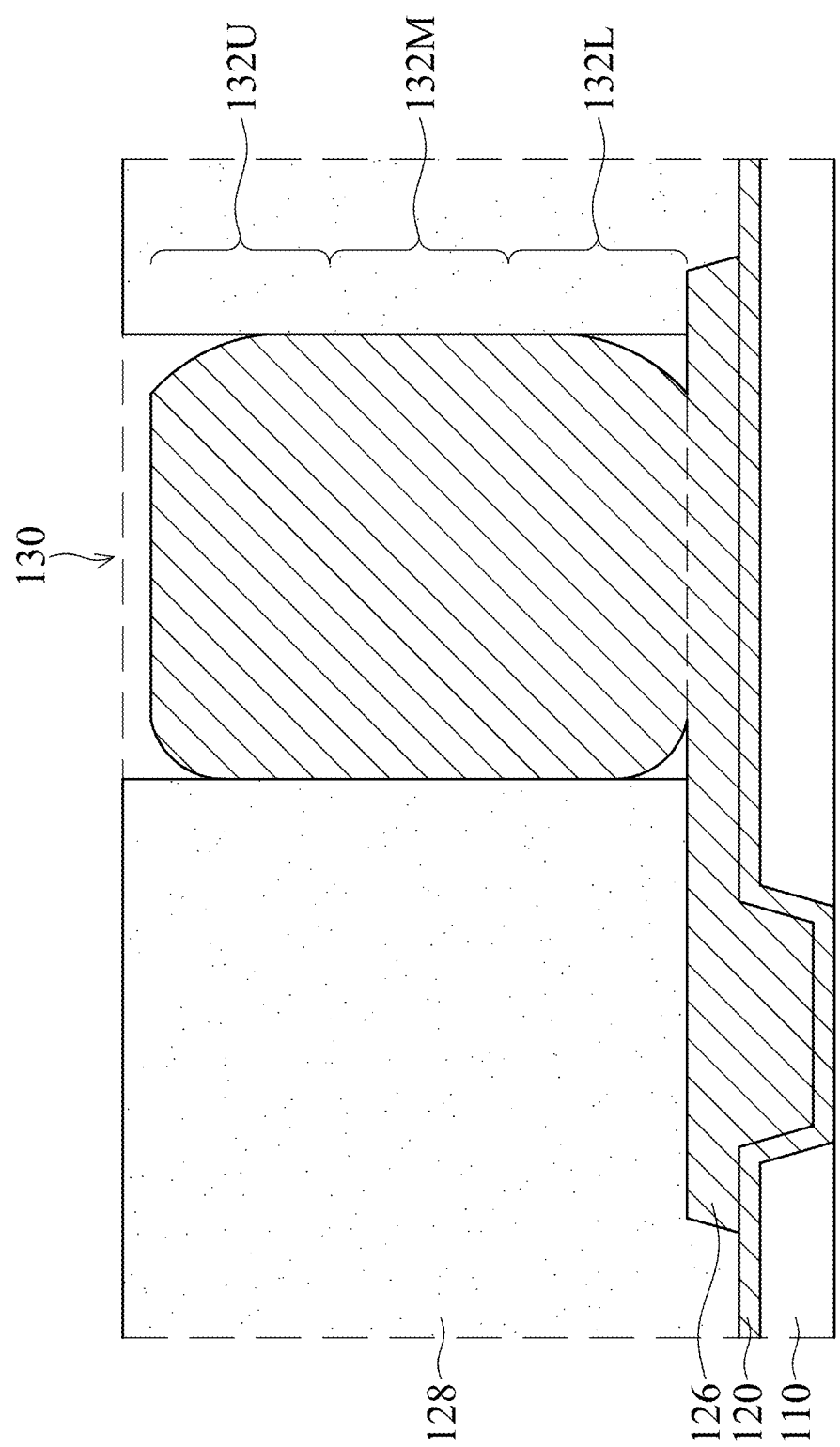

FIGS. 13A-13C are cross-sectional views of intermediate stages in the manufacturing of the UBMLs 114 and the through vias 116, in accordance with some other embodiments. Details in a region 100R of FIG. 5 are illustrated. FIGS. 13A-13C illustrate the formation of a conductive material 132 for through vias 116 with convex sidewalls, such that each of the through vias 116 has a bulged rectangle shape. The process described for FIGS. 13A-13C may be performed in lieu of the process described for FIGS. 6E-6G, such that the process described for FIGS. 6A-6D is performed before the process described for FIGS. 13A-13C, and then the process described for FIG. 6H is performed after the process described for FIGS. 13A-13C. Similar to the process described for FIGS. 6E-6G, a plurality of plating speeds will be utilized to plate the lower, middle, and upper portions of the conductive material 132, thereby causing the conductive material 132 to have convex sidewalls.

In FIG. 13A, a lower portion of the conductive material 132L is formed in the openings 130 of the second mask 128 and on the exposed portion of the conductive material 126.

The conductive material 132L has sidewalls that taper outward. As such, a width of the conductive material 132L increases in a direction away from the seed layer 120. The outwardly-tapered sidewalls are curved. The conductive material 132L may be formed with outwardly-tapered sidewalls by initially plating the conductive material 132L with a high plating speed, and then subsequently plating the conductive material 132L with a low plating speed. Beginning the electroplating process with a high plating speed and then transitioning to a low plating speed increases the plating conformality of the electroplating process in the openings 130, thereby forming the conductive material 132L with outwardly-tapered sidewalls. The electroplating process may be performed with a high plating speed by plating with a high plating current density, and the electroplating process may be performed with a low plating speed by plating with a low plating current density. When a lower plating speed is utilized, the plating may be performed for a longer duration so that the conductive material 132L is sufficiently thick. In some embodiments, the conductive material 132L is plated with a plating current density in the range of 25 $A/dm^2$ to 44 $A/dm^2$ for a duration in the range of 200 seconds to 400 seconds, and is then plated with a plating current density in in the range of 8 $A/dm^2$ to 12 $A/dm^2$ for a duration in the range of 600 seconds to 1600 seconds. Plating the conductive material 132L using plating current densities and durations in these ranges allows the conductive material 132L to be formed to a sufficient thickness with outwardly-tapered sidewalls. In some embodiments, the conductive material 132L has a thickness in the range of 15 μm to 25 μm.

In FIG. 13B, a middle portion of the conductive material 132M is formed in the openings 130 of the second mask 128 and on the lower portion of the conductive material 132L. The conductive material 132M has sidewalls that are substantially straight (within process variations), where the straight sidewalls are perpendicular to a major surface of the seed layer 120. As such, a width of the conductive material 132M is constant in a direction away from the seed layer 120. The conductive material 132M may be formed with straight sidewalls by plating the conductive material 132M with a medium plating speed. The medium plating speed used to plate the conductive material 132M may be faster than the low plating speed used to plate the conductive material 132L, and may be slower than the high plating speed used to plate the conductive material 132L. The conductive material 132M may be plated with a medium plating speed by plating with a medium plating current density. In some embodiments, the conductive material 132M is plated with a plating current density in the range of 12 $A/dm^2$ to 16 $A/dm^2$ for a duration in the range of 1000 seconds to 1600 seconds. Plating the conductive material 132M using a plating current density and duration in these ranges allows the conductive material 132M to be formed with straight sidewalls and to a desired thickness. In some embodiments, the conductive material 132M has a thickness in the range of 35 μm to 45 μm.

In FIG. 13C, an upper portion of the conductive material 132U is formed in the openings 130 of the second mask 128 and on the middle portion of the conductive material 132M. The conductive material 132U has sidewalls that taper inward. As such, a width of the conductive material 132U decreases in a direction away from the seed layer 120. The inwardly-tapered sidewalls are curved. The conductive material 132U may be formed with inwardly-tapered sidewalls by initially plating the conductive material 132U with a low plating speed, and then subsequently plating the conductive material 132U with a high plating speed. The medium plating speed used to plate the conductive material 132M may be faster than the low plating speed used to plate the conductive material 132U, and may be slower than the high plating speed used to plate the conductive material 132U. Beginning the electroplating process with a low plating speed and then transitioning to a high plating speed decrease the plating conformality of the electroplating process in the openings 130, thereby forming the conductive material 132U with inwardly-tapered sidewalls. The electroplating process may be performed with a high plating speed by plating with a high plating current density, and the electroplating process may be performed with a low plating speed by plating with a low plating current density. When a lower plating speed is utilized, the plating may be performed for a longer duration so that the conductive material 132U is sufficiently thick. In some embodiments, the conductive material 132U is plated with a plating current density in the range of 8 $A/dm^2$ to 12 $A/dm^2$ for a duration in the range of 600 seconds to 1000 seconds, and is then plated with a plating current density in the range of 30 $A/dm^2$ to 44 $A/dm^2$ for a duration in the range of 150 seconds to 300 seconds. Plating the conductive material 132U using plating current densities and durations in these ranges allows the conductive material 132U to be formed to a sufficient thickness with inwardly-tapered sidewalls. In some embodiments, the conductive material 132U has a thickness in the range of 15 μm to 25 μm.

Figure 14:
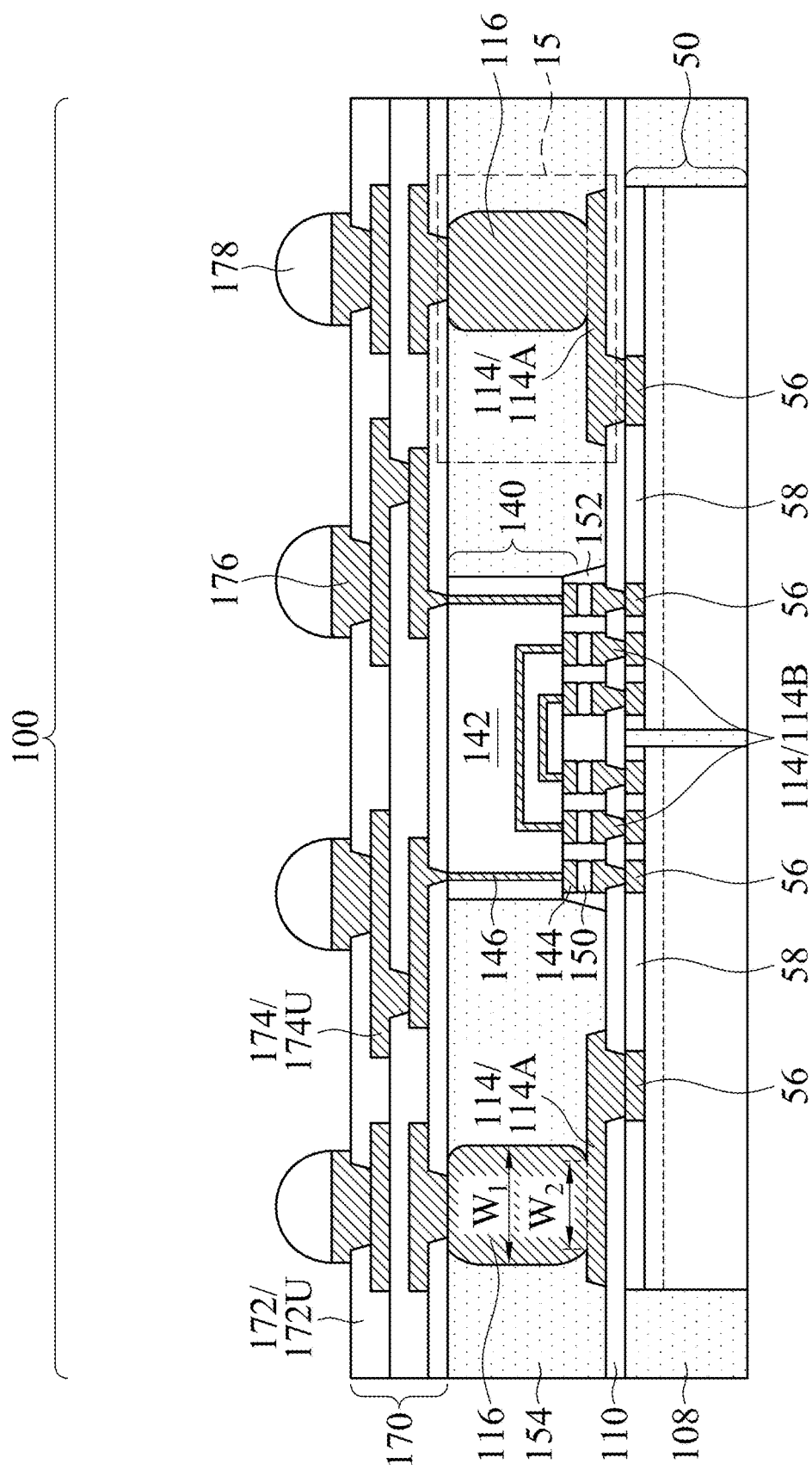
FIG. 14-15 are cross-sectional views of an integrated circuit package, in accordance with some embodiments.

FIG. 14 is a cross-sectional view of an integrated circuit package 100, in accordance with some embodiments. This embodiment is similar to the embodiment described for FIG. 10, except each of the through vias 116 has a bulged rectangle shape. As a result of the bulged rectangle shape, the through vias 116 have multiple widths (subsequently described for FIG. 15), such that the center portions of the through vias 116 have a greater width than the end portions of the through vias 116. In a similar manner as described for FIG. 12, an integrated circuit device 300 may be formed by bonding the integrated circuit package 100 of FIG. 14 to a package substrate 200.

Figure 15:
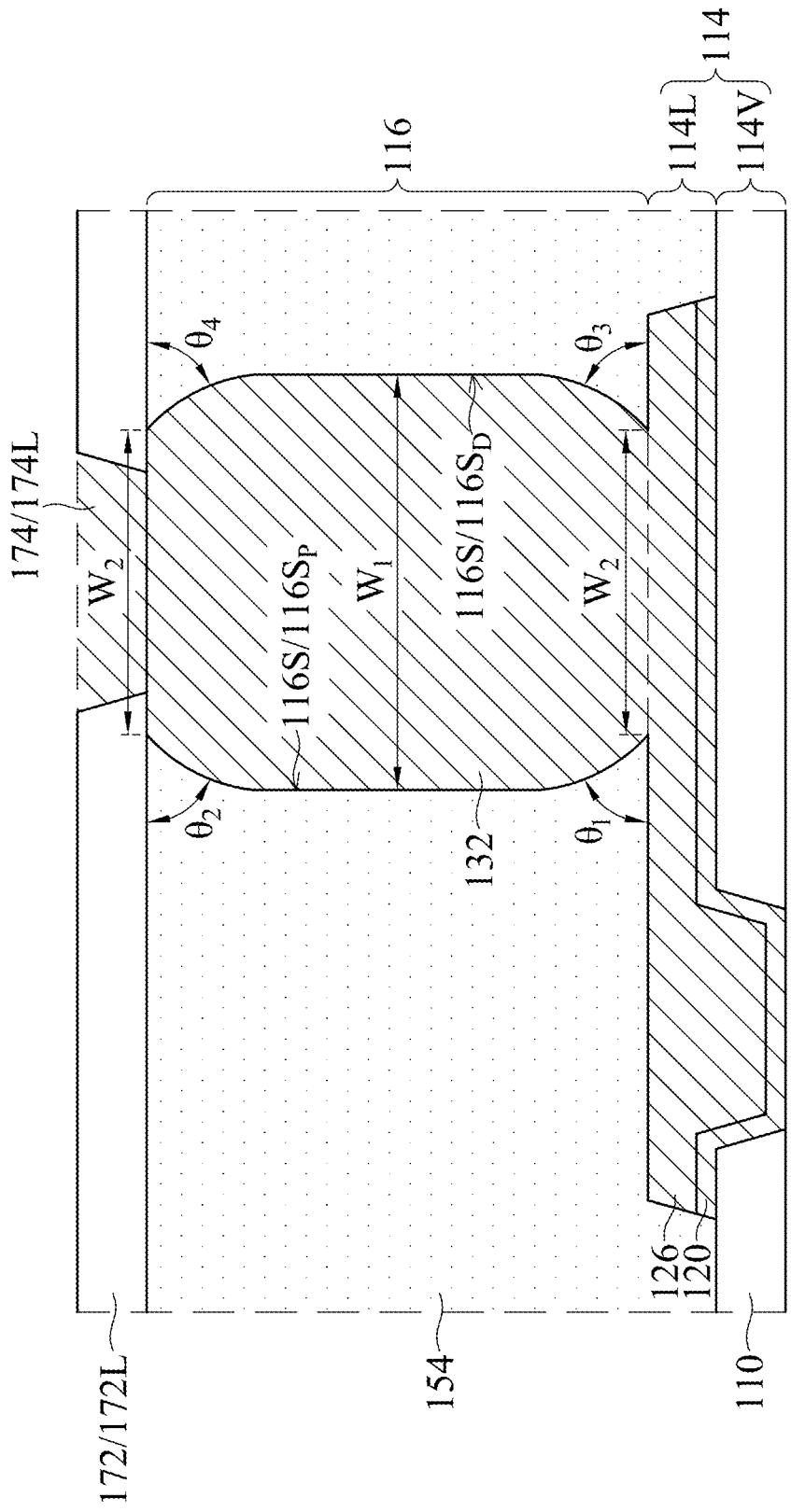

FIG. 15 is a cross-sectional view of an integrated circuit package 100, in accordance with some embodiments. Details in a region 15 of FIG. 14 are illustrated. Specifically, a through via 116 and an underlying UBML 114 are shown.

In this embodiment, the curved sidewalls 116S are convex sidewalls, such that the through via 116 has a bulged rectangle shape. As a result of the bulged rectangle shape, the second width $W_2$ is less than the first width $W_1$. In some embodiments, the first width $W_1$ is about 135 μm (such as in the range of 130 μm to 140 μm) and the second width $W_2$ is about 150 μm (such as in the range of 145 μm to 155 μm). A width of a through via 116 increases in a direction towards the UBML 114 until a point, and then decreases in that direction.

As noted above, the through via 116 may be laterally offset from the via portion 114V of the underlying UBML 114. The proximal sidewall $116S_P$ has a longer arc length than the distal sidewall $116S_D$, which allows the proximal sidewall $116S_P$ to reduce or disperse more stress than the distal sidewall $116S_D$. In some embodiments, the proximal sidewall $116S_P$ has an arc length of about 105 μm (such as in the range of 100 μm to 110 μm) and the distal sidewall $116S_D$ has an arc length of about 90 μm (such as in the range of 85 μm to 95 μm). The proximal sidewall $116S_P$ may be formed with a longer arc length than the distal sidewall $116S_D$ by asymmetrically plating the conductive material 132 (previously described for FIGS. 13A-13C).

Because the curved sidewalls 116S are convex sidewalls, they form acute angles with the top surface of the UBML 114 and with the bottom surface of the lower dielectric layer 172L of the redistribution structure 170. The angles $\theta_1$, $\theta_2$, $\theta_3$, $\theta_4$ are each in the range of 60 degrees to 90 degrees. Forming any of the angles $\theta_1$, $\theta_2$, $\theta_3$, $\theta_4$ to be less than 60 degrees may cause the first width $W_1$ of the through via 116 to be too large, thereby increasing the volume (and thus manufacturing cost) of the through via 116. The first angle $\theta_1$ may be equal to the second angle $\theta_2$, and the third angle $\theta_3$ may be equal to the fourth angle $\theta_4$. In embodiments where the proximal sidewall 116S$_P$ has a longer arc length than the distal sidewall 116S$_D$, the first angle $\theta_1$ is smaller than the third angle $\theta_3$ and the fourth angle $\theta_4$, and the second angle $\theta_2$ is also smaller than the third angle $\theta_3$ and the fourth angle $\theta_4$.

Figure 16:
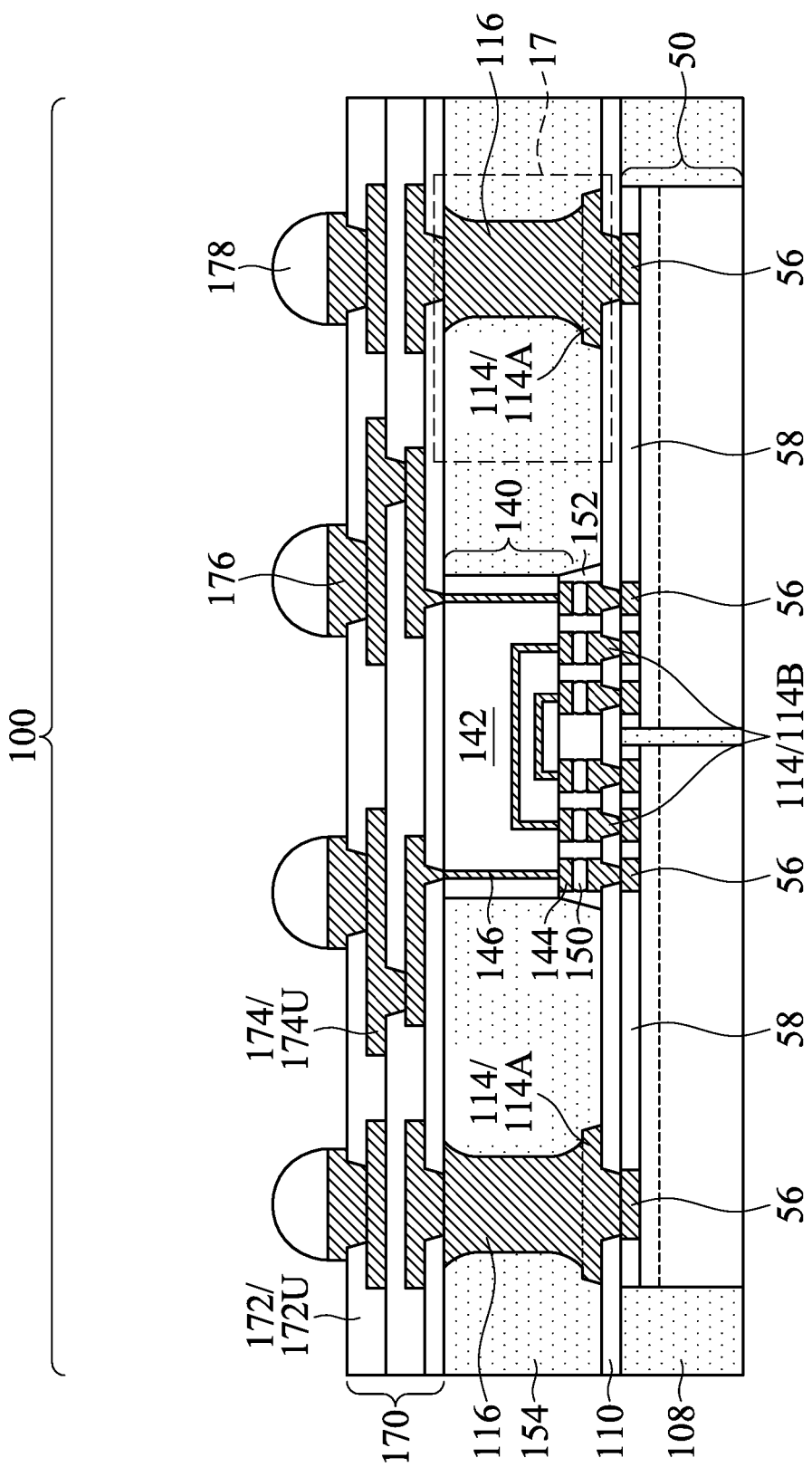
FIGS. 16-17 are cross-sectional views of an integrated circuit package, in accordance with some embodiments.

FIG. 16 is a cross-sectional view of an integrated circuit package 100, in accordance with some embodiments. This embodiment is similar to the embodiment described for FIG. 10, except the through vias 116 are aligned with the via portions 114V of the underlying UBMLs 114, such that the through vias 116 are not laterally offset from the respective via portions 114V. In a similar manner as described for FIG. 12, an integrated circuit device 300 may be formed by bonding the integrated circuit package 100 of FIG. 16 to a package substrate 200.

Figure 17:
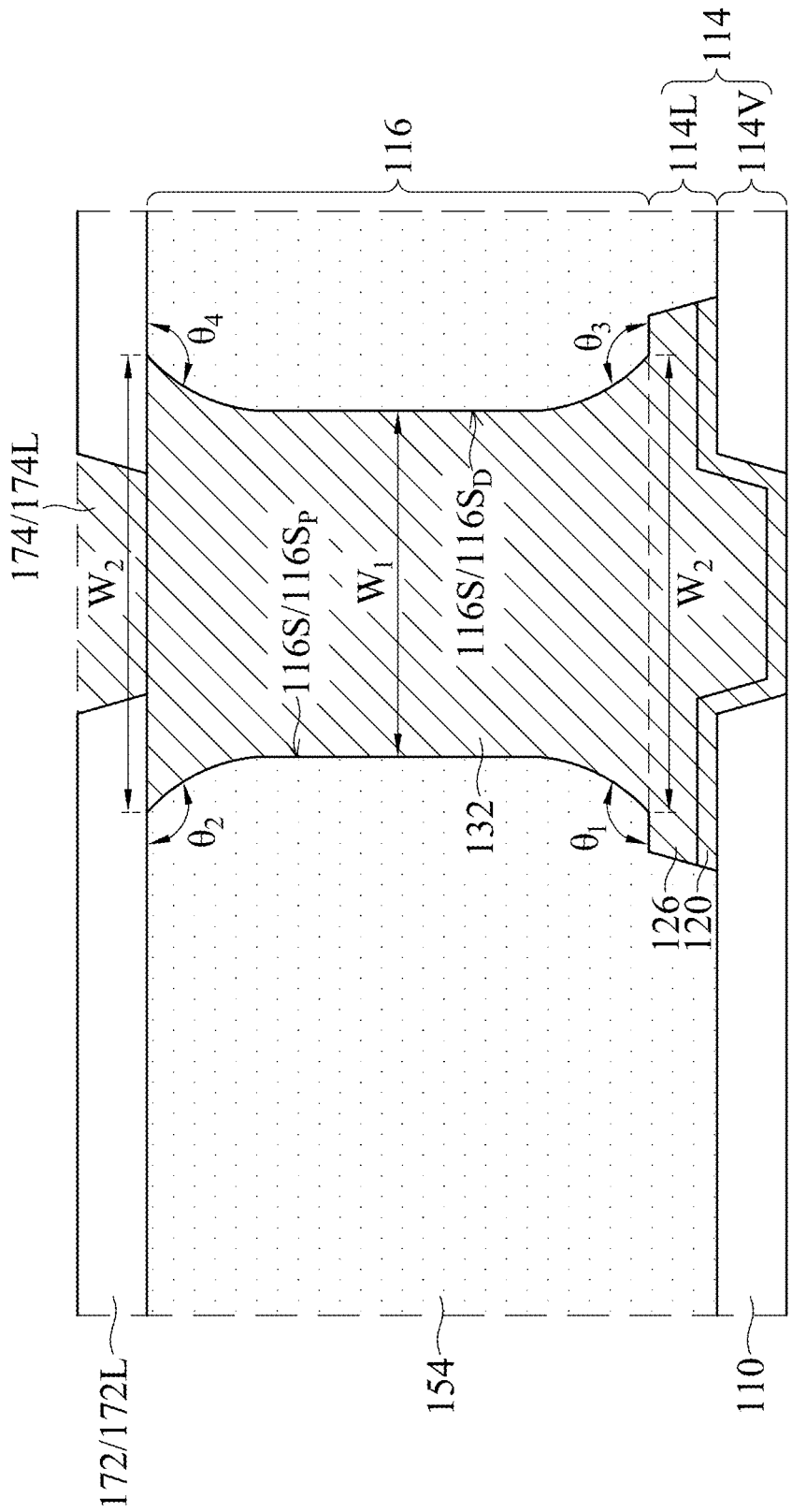

FIG. 17 is a cross-sectional view of an integrated circuit package 100, in accordance with some embodiments. Details in a region 17 of FIG. 16 are illustrated. Specifically, a through via 116 and an underlying UBML 114 are shown. In this embodiment the proximal sidewalls 116S$_P$ have the same arc length as the distal sidewalls 116S$_D$. Further, the first angle $\theta_1$ is equal to the third angle $\theta_3$, and the second angle $\theta_2$ is equal to the fourth angle $\theta_4$. The proximal sidewall 116S$_P$ may be formed with the same arc length as the distal sidewall 116S$_D$ by symmetrically plating the conductive material 132 (previously described for FIGS. 6E-6G).

Figure 18:
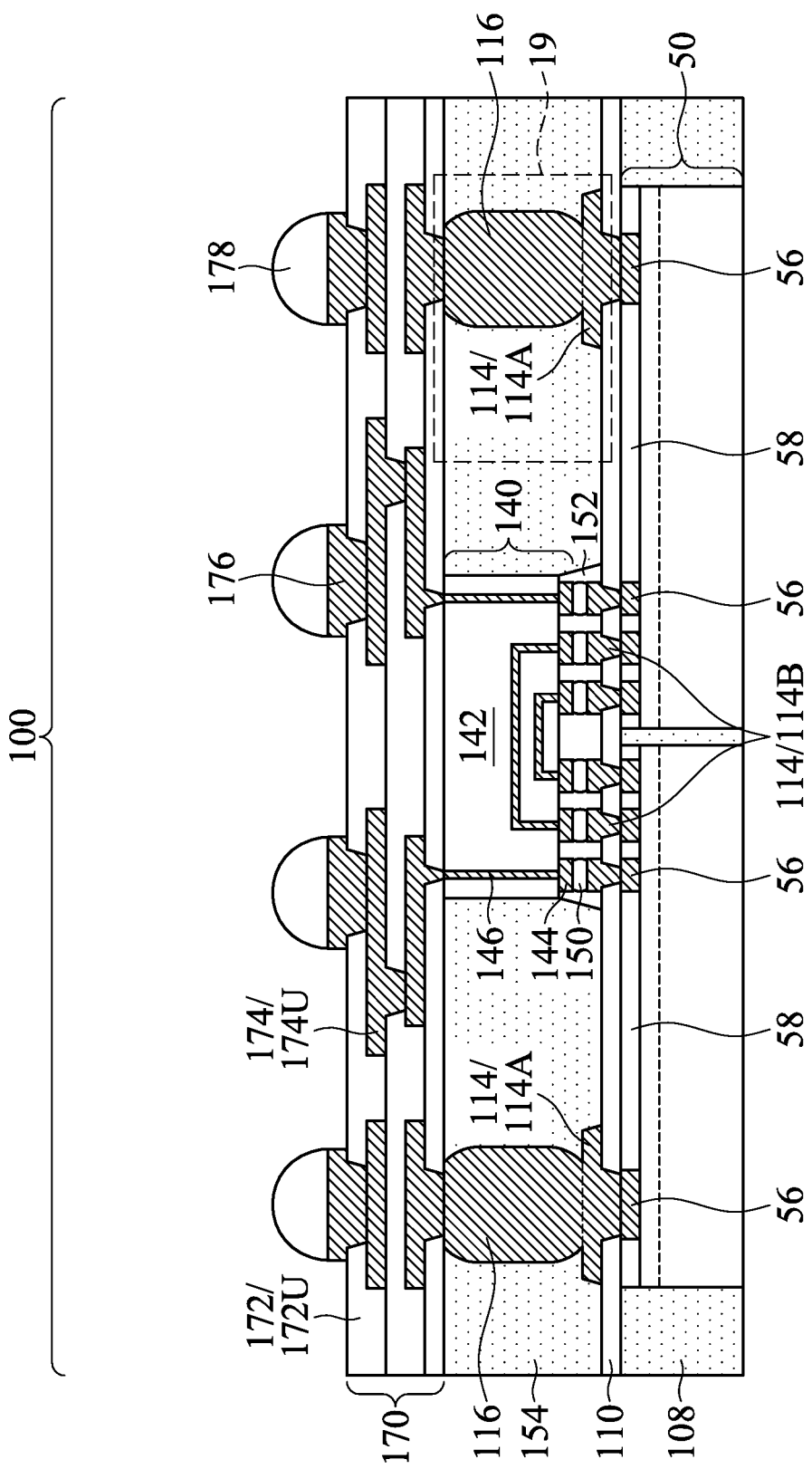
FIGS. 18-19 are cross-sectional views of an integrated circuit package, in accordance with some embodiments.

FIG. 18 is a cross-sectional view of an integrated circuit package 100, in accordance with some embodiments. This embodiment is similar to the embodiment described for FIG. 14, except the through vias 116 are aligned with the via portions 114V of the underlying UBMLs 114, such that the through vias 116 are not laterally offset from the respective via portions 114V. In a similar manner as described for FIG. 12, an integrated circuit device 300 may be formed by bonding the integrated circuit package 100 of FIG. 18 to a package substrate 200.

Figure 19:
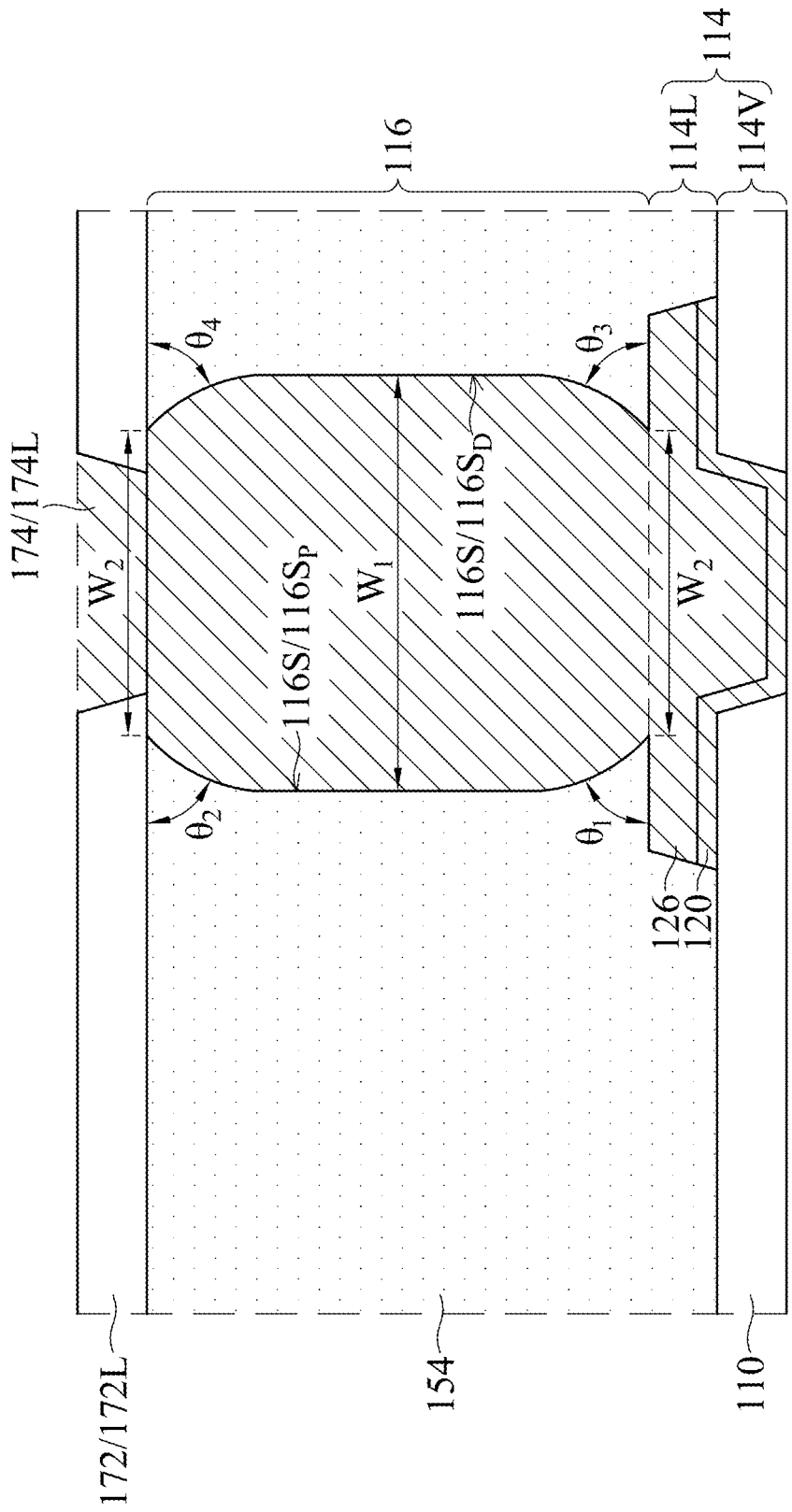

FIG. 19 is a cross-sectional view of an integrated circuit package 100, in accordance with some embodiments. Details in a region 19 of FIG. 18 are illustrated. Specifically, a through via 116 and an underlying UBML 114 are shown. In this embodiment the proximal sidewalls 116S$_P$ have the same arc length as the distal sidewalls 116S$_D$. Further, the first angle $\theta_1$ is equal to the third angle $\theta_3$, and the second angle $\theta_2$ is equal to the fourth angle $\theta_4$. The proximal sidewall 116S$_P$ may be formed with the same arc length as the distal sidewall 116S$_D$ by symmetrically plating the conductive material 132 (previously described for FIGS. 13A-13C).

In an embodiment, a device includes: an integrated circuit die including a die connector; a dielectric layer on the integrated circuit die; an under-bump metallurgy layer having a line portion on the dielectric layer and having a via portion extending through the dielectric layer to contact the die connector; a through via on the line portion of the under-bump metallurgy layer, the through via having a first curved sidewall proximate the die connector, the through via having a second curved sidewall distal the die connector, the first curved sidewall having a longer arc length than the second curved sidewall; and an encapsulant around the through via and the under-bump metallurgy layer. In some embodiments of the device, the first curved sidewall and the second curved sidewall are concave sidewalls. In some embodiments of the device, the concave sidewalls form obtuse angles with a top surface of the line portion of the under-bump metallurgy layer. In some embodiments of the device, a center portion of the through via has a first width, end portions of the through via each have a second width, and the second width is greater than the first width. In some embodiments of the device, the first curved sidewall and the second curved sidewall are convex sidewalls. In some embodiments of the device, the convex sidewalls form acute angles with a top surface of the line portion of the under-bump metallurgy layer. In some embodiments of the device, a center portion of the through via has a first width, end portions of the through via each have a second width, and the second width is less than the first width. In some embodiments of the device, the under-bump metallurgy layer includes a seed layer and a first conductive material, the through via includes a second conductive material, and no seed layers are disposed between the first conductive material and the second conductive material.

In an embodiment, a device includes: a first integrated circuit die; a second integrated circuit die adjacent the first integrated circuit die; an under-bump metallurgy layer physically and electrically coupled to the second integrated circuit die; an encapsulant on the under-bump metallurgy layer; a through via extending through the encapsulant, the through via and the under-bump metallurgy layer including the same continuous metal, a first interface between the through via and the encapsulant being curved, a second interface between the through via and the encapsulant being curved, the first interface having a first arc length, the second interface having a second arc length, the second arc length being different from the first arc length; and an interconnection die in the encapsulant, the interconnection die including die bridges, the die bridges directly connecting the first integrated circuit die to the second integrated circuit die. In some embodiments of the device, the through via has an hourglass shape. In some embodiments of the device, the through via has a bulged rectangle shape. In some embodiments, the device further includes: a redistribution structure on the encapsulant, the redistribution structure including a redistribution line, the redistribution line physically and electrically coupled to the through via. In some embodiments of the device, the interconnection die is a local silicon interconnect.

In an embodiment, a method includes: forming a first mask on a seed layer, a first opening in the first mask exposing a first portion of the seed layer; plating a first conductive material in the first opening and on the first portion of the seed layer; removing the first mask; forming a second mask on the first conductive material and the seed layer, a second opening in the second mask exposing a second portion of the first conductive material; plating a second conductive material in the second opening and on the second portion of the first conductive material, the second conductive material plated with a plurality of plating speeds, the second conductive material having curved sidewalls; and removing the second mask and exposed portions of the seed layer. In some embodiments of the method, the curved sidewalls are concave sidewalls. In some embodiments of the method, plating the second conductive material includes:

plating a lower portion of the second conductive material with a first plating speed and then with a second plating speed, the second plating speed faster than the first plating speed; plating a middle portion of the second conductive material; and plating an upper portion of the second conductive material with a third plating speed and then with a fourth plating speed, the fourth plating speed slower than the third plating speed. In some embodiments of the method, the lower portion of the second conductive material is plated with a first plating current density and then with a second plating current density, the upper portion of the second conductive material is plated with a third plating current density and then with a fourth plating current density, the second plating current density is greater than the first plating current density, and the fourth plating current density is less than the third plating current density. In some embodiments of the method, the curved sidewalls are convex sidewalls. In some embodiments of the method, plating the second conductive material includes: plating a lower portion of the second conductive material with a first plating speed and then with a second plating speed, the second plating speed slower than the first plating speed; plating a middle portion of the second conductive material; and plating an upper portion of the second conductive material with a third plating speed and then with a fourth plating speed, the fourth plating speed faster than the third plating speed. In some embodiments of the method, the lower portion of the second conductive material is plated with a first plating current density and then with a second plating current density, the upper portion of the second conductive material is plated with a third plating current density and then with a fourth plating current density, the second plating current density is less than the first plating current density, and the fourth plating current density is greater than the third plating current density.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first mask on a seed layer, a first opening in the first mask exposing a first portion of the seed layer;
   plating a first conductive material in the first opening and on the first portion of the seed layer;
   removing the first mask;
   forming a second mask on the first conductive material and the seed layer, a second opening in the second mask exposing a second portion of the first conductive material;
   plating a second conductive material in the second opening and on the second portion of the first conductive material, the second conductive material plated with a plurality of plating speeds, the second conductive material having curved sidewalls spaced apart by an air gap from sidewalls of the second opening; and
   removing the second mask and exposed portions of the seed layer.

2. The method of claim 1, wherein the curved sidewalls are concave sidewalls.

3. The method of claim 2, wherein plating the second conductive material comprises:
   plating a lower portion of the second conductive material with a first plating speed and then with a second plating speed, the second plating speed faster than the first plating speed;
   plating a middle portion of the second conductive material; and
   plating an upper portion of the second conductive material with a third plating speed and then with a fourth plating speed, the fourth plating speed slower than the third plating speed.

4. The method of claim 3, wherein the lower portion of the second conductive material is plated with a first plating current density and then with a second plating current density, the upper portion of the second conductive material is plated with a third plating current density and then with a fourth plating current density, the second plating current density is greater than the first plating current density, and the fourth plating current density is less than the third plating current density.

5. The method of claim 1, wherein the curved sidewalls are convex sidewalls.

6. The method of claim 5, wherein plating the second conductive material comprises:
   plating a lower portion of the second conductive material with a first plating speed and then with a second plating speed, the second plating speed slower than the first plating speed;
   plating a middle portion of the second conductive material; and
   plating an upper portion of the second conductive material with a third plating speed and then with a fourth plating speed, the fourth plating speed faster than the third plating speed.

7. The method of claim 6, wherein the lower portion of the second conductive material is plated with a first plating current density and then with a second plating current density, the upper portion of the second conductive material is plated with a third plating current density and then with a fourth plating current density, the second plating current density is less than the first plating current density, and the fourth plating current density is greater than the third plating current density.

8. A method comprising:
   forming a first mask having a first opening;
   plating a first conductive material in the first opening;
   removing the first mask;
   forming a second mask on the first conductive material, a second opening in the second mask exposing a portion of the first conductive material;
   plating a second conductive material in the second opening and on the exposed portion of the first conductive material, the second conductive material plated directly from the first conductive material with a plurality of plating speeds, the second conductive material having curved sidewalls, wherein after plating at least a portion of the curved sidewalls is spaced apart by an air gap from sidewalls of the second opening; and
   removing the second mask.

9. The method of claim 8, wherein the curved sidewalls are concave sidewalls.

10. The method of claim 8, wherein plating the second conductive material comprises:

plating a lower portion of the second conductive material with a first plating speed and then with a second plating speed;
plating a middle portion of the second conductive material with a third plating speed, the third plating speed being slower than the second plating speed and faster than the first plating speed; and
plating an upper portion of the second conductive material.

11. The method of claim 8, wherein the curved sidewalls are convex sidewalls.

12. The method of claim 8, wherein plating the second conductive material comprises:
plating a lower portion of the second conductive material with a first plating speed and then with a second plating speed;
plating a middle portion of the second conductive material with a third plating speed, the third plating speed being faster than the second plating speed and slower than the first plating speed; and
plating an upper portion of the second conductive material.

13. A method comprising:
forming a dielectric layer;
forming an under-bump metallurgy layer having a line portion on the dielectric layer and having a via portion extending through the dielectric layer;
forming a mask on the under-bump metallurgy layer, the mask having an opening exposing the line portion of the under-bump metallurgy layer;
forming a through via in the opening and on the line portion of the under-bump metallurgy layer by plating a conductive material with a workpiece oriented vertically in a plating solution, wherein forming the through via comprises:
plating a lower portion of the conductive material by initially plating with a first plating speed and then with a second plating speed to create curved sidewalls, the second plating speed being different than the first plating speed;
plating a middle portion of the conductive material with a third plating speed to create straight sidewalls; and
plating an upper portion of the conductive material by initially plating with a fourth plating speed and then with a fifth plating speed to create curved sidewalls, the fifth plating speed being different than the fourth plating speed, the through via having a first curved sidewall proximate the via portion in a cross-sectional view, the through via having a second curved sidewall distal the via portion, the first curved sidewall having a longer arc length extending from the line portion to an upper surface of the through via than the second curved sidewall extending from the line portion to the upper surface of the through via; and
removing the mask.

14. The method of claim 13, wherein the first curved sidewall and the second curved sidewall are concave sidewalls.

15. The method of claim 14, wherein the second plating speed is faster than the first plating speed and the fifth plating speed.

16. The method of claim 13, wherein the first curved sidewall and the second curved sidewall are convex sidewalls.

17. The method of claim 16, wherein the second plating speed is slower than the first plating speed and the fifth plating speed.

18. The method of claim 13, wherein forming the through via comprises plating a conductive material of the through via directly from a conductive material of the under-bump metallurgy layer.

19. The method of claim 13, further comprising:
placing an interconnection die adjacent the through via.

20. The method of claim 19, further comprising:
encapsulating the interconnection die, the through via, and the under-bump metallurgy layer with an encapsulant.

* * * * *